(12) United States Patent
Kwon

(10) Patent No.: US 10,714,558 B2
(45) Date of Patent: Jul. 14, 2020

(54) DISPLAY PANEL AND DISPLAY DEVICE

(71) Applicant: LG DISPLAY CO., LTD., Seoul (KR)

(72) Inventor: OhNam Kwon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 35 days.

(21) Appl. No.: 15/299,639

(22) Filed: Oct. 21, 2016

(65) Prior Publication Data

US 2017/0117342 A1 Apr. 27, 2017

(30) Foreign Application Priority Data

Oct. 21, 2015 (KR) .......................... 10-2015-0146907

(51) Int. Cl.
| | |
|---|---|
| *G09G 3/3291* | (2016.01) |
| *H01L 27/32* | (2006.01) |
| *G09G 3/325* | (2016.01) |
| *G09G 3/3266* | (2016.01) |
| *H01L 51/50* | (2006.01) |
| *H01L 51/52* | (2006.01) |
| *H01L 51/00* | (2006.01) |

(52) U.S. Cl.
CPC ......... *H01L 27/3267* (2013.01); *G09G 3/325* (2013.01); *G09G 3/3266* (2013.01); *G09G 3/3291* (2013.01); *H01L 27/3276* (2013.01); *H01L 51/5012* (2013.01); *H01L 51/5206* (2013.01); *H01L 51/5221* (2013.01); *H01L 51/5271* (2013.01); *G09G 2300/0809* (2013.01); *G09G 2310/027* (2013.01); *G09G 2310/0286* (2013.01); *G09G 2310/0291* (2013.01); *G09G 2380/02* (2013.01); *H01L 51/0097* (2013.01); *H01L 2251/533* (2013.01); *H01L 2251/5315* (2013.01); *H01L 2251/5323* (2013.01); *H01L 2251/5338* (2013.01)

(58) Field of Classification Search
CPC .... G09G 3/325; G09G 3/3266; G09G 3/3291; G09G 2300/0809; G09G 2310/027; G09G 2310/0286; G09G 2310/0291; G09G 2380/02; H01L 27/3267; H01L 27/3276; H01L 51/5012; H01L 51/5206; H01L 51/5221; H01L 51/5271; H01L 2251/5315
See application file for complete search history.

(56) References Cited

U.S. PATENT DOCUMENTS

2004/0227159 A1 11/2004 Nakashima et al.
2004/0239658 A1 12/2004 Koyama et al.
(Continued)

FOREIGN PATENT DOCUMENTS

| CN | 1551692 A | 12/2004 |
|---|---|---|
| CN | 100370492 C | 2/2008 |

(Continued)

*Primary Examiner* — Stacy Khoo
(74) *Attorney, Agent, or Firm* — Morgan, Lewis & Bockius LLP

(57) ABSTRACT

A display panel and a display device including the same are provided. A display device includes a display panel having a plurality of data lines and a plurality of gate lines thereon, the display panel including at least one first area and at least one second area having different light-emitting directions; a data driver circuit configured to drive the plurality of data lines; and a gate driver circuit configured to drive the plurality of gate lines.

21 Claims, 31 Drawing Sheets

(56) References Cited

U.S. PATENT DOCUMENTS

| | | | |
|---|---|---|---|
| 2006/0038752 A1* | 2/2006 | Winters | G09G 3/3225 345/76 |
| 2007/0045620 A1* | 3/2007 | Park | G09G 3/3233 257/40 |
| 2009/0273279 A1* | 11/2009 | Chino | H01L 51/5228 313/504 |
| 2010/0115807 A1 | 5/2010 | Shim et al. | |
| 2011/0148944 A1* | 6/2011 | Kobayashi | G09G 3/3225 345/690 |
| 2012/0074435 A1* | 3/2012 | Ha | H01L 51/5203 257/88 |
| 2014/0049449 A1* | 2/2014 | Park | G09G 5/00 345/1.3 |
| 2014/0145161 A1* | 5/2014 | Naijo | H01L 51/0097 257/40 |
| 2014/0167626 A1 | 6/2014 | Kim et al. | |
| 2014/0183478 A1 | 7/2014 | Lee et al. | |
| 2015/0022561 A1* | 1/2015 | Ikeda | G06F 1/1652 345/690 |
| 2015/0144908 A1* | 5/2015 | Yoon | H01L 27/3216 257/40 |
| 2015/0227172 A1* | 8/2015 | Namkung | G06F 1/1652 345/173 |
| 2015/0287365 A1 | 10/2015 | Song et al. | |
| 2016/0247436 A1* | 8/2016 | Lee | G09G 3/2003 |
| 2017/0092171 A1* | 3/2017 | Knausz | G06F 3/0416 |

FOREIGN PATENT DOCUMENTS

| | | | |
|---|---|---|---|
| CN | 100539174 C | 9/2009 | |
| CN | 101739905 A | 6/2010 | |
| CN | 103872251 A | 6/2014 | |
| CN | 104885142 A | 9/2015 | |
| CN | 104978899 A | 10/2015 | |
| JP | 2015050011 A | * 3/2015 | H01L 51/5218 |

* cited by examiner

FIG.12
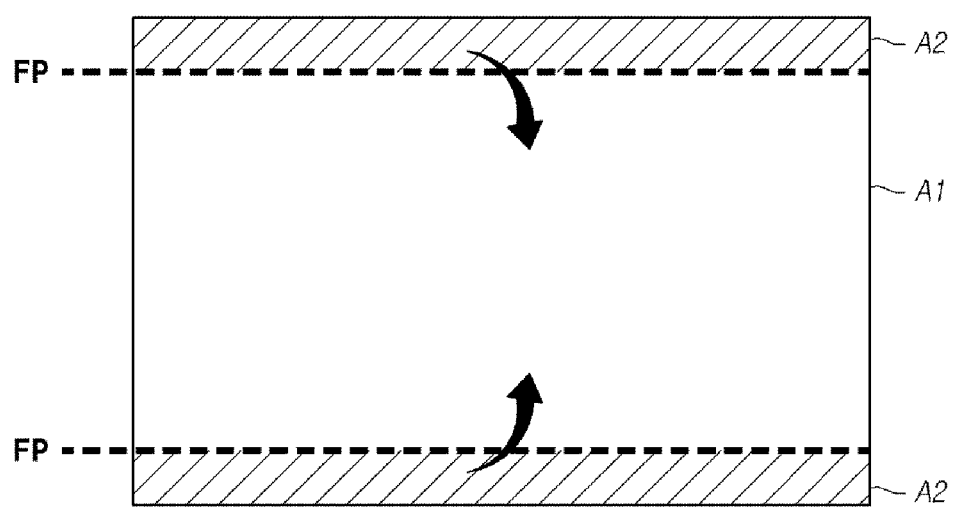
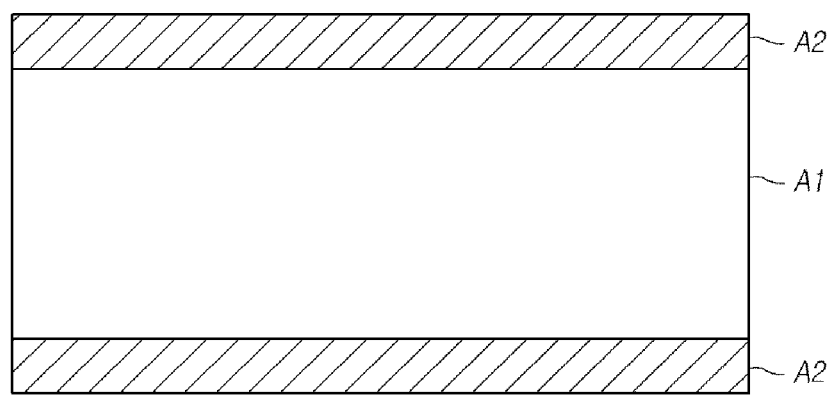

FIG.13
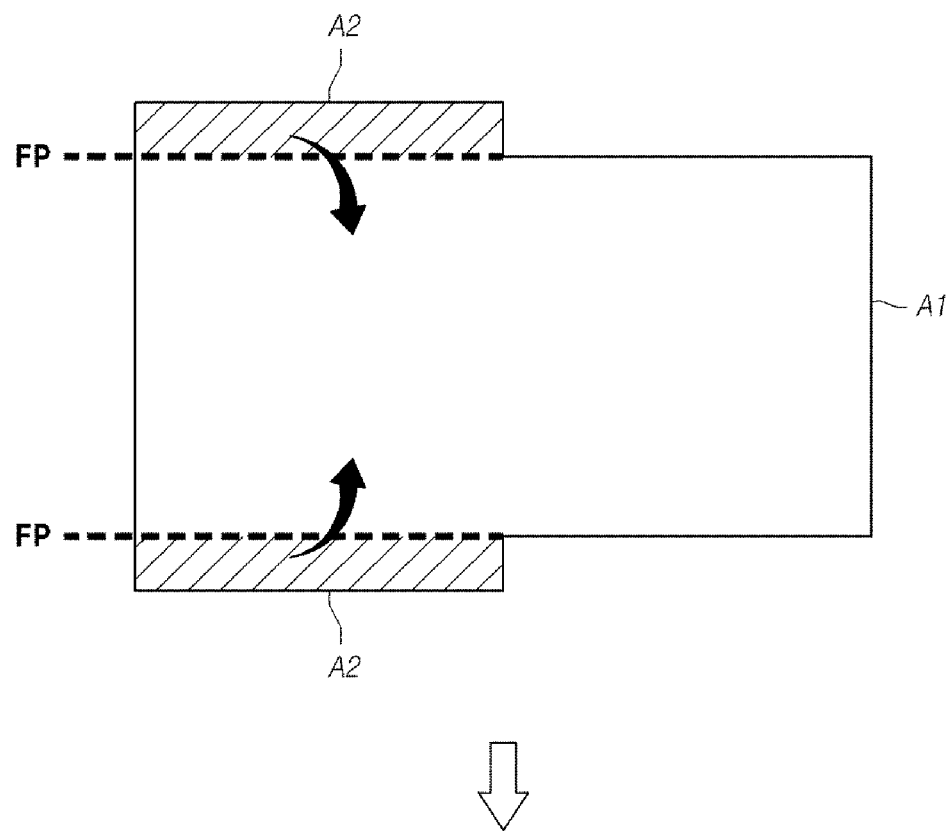
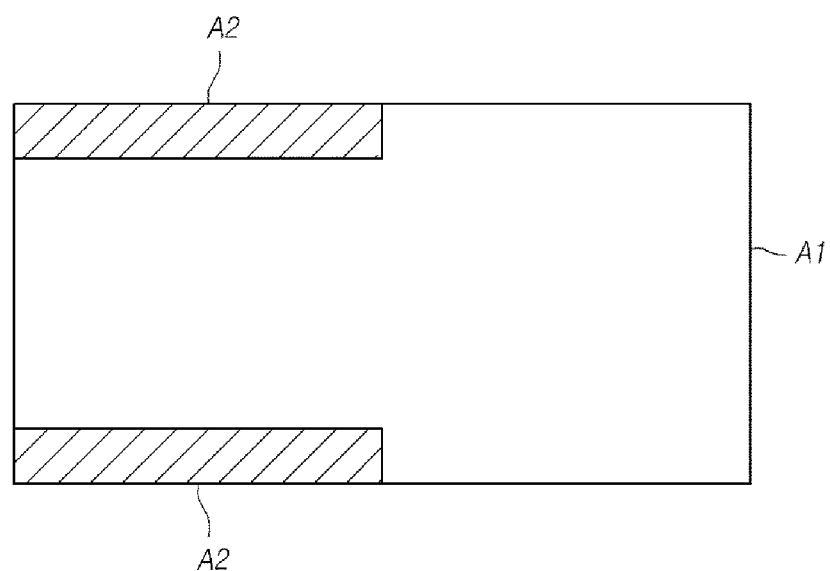

FIG. 14
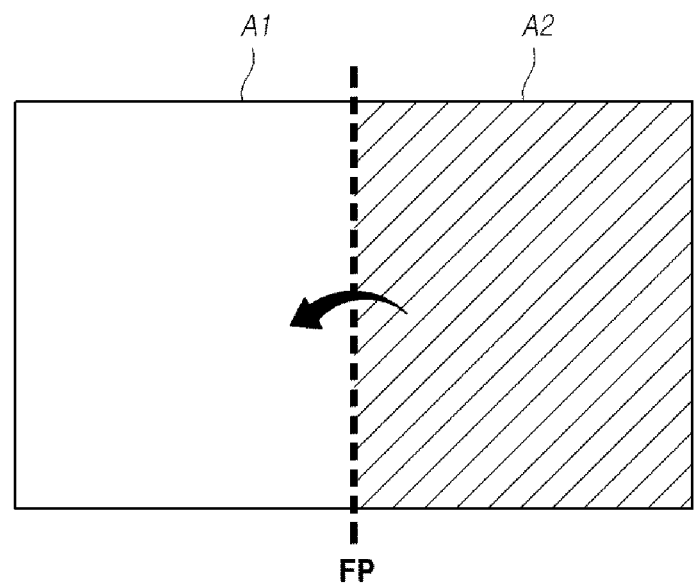
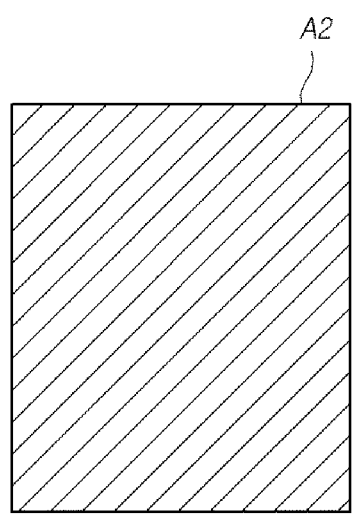

FIG.15
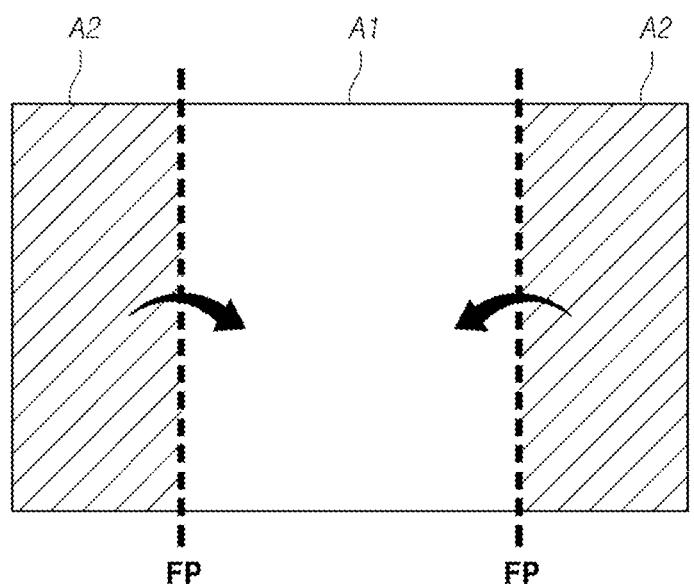
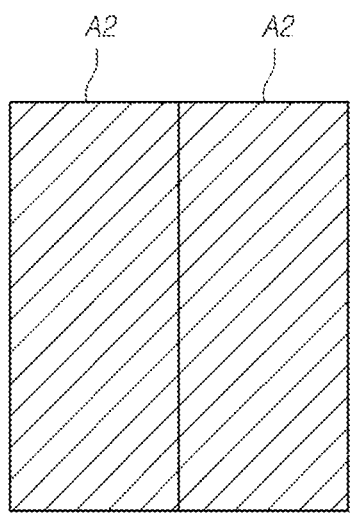

FIG.17
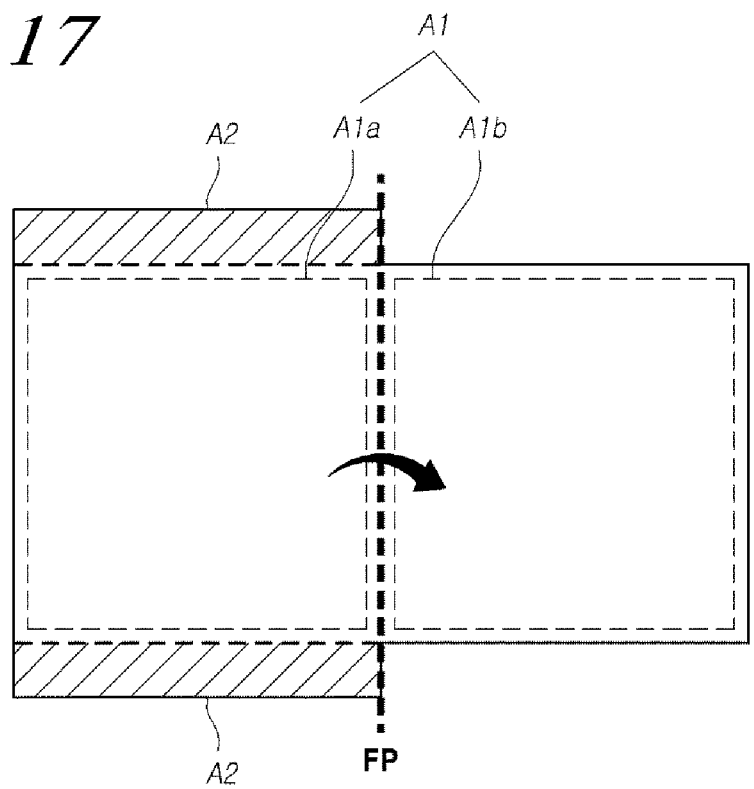
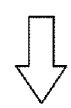
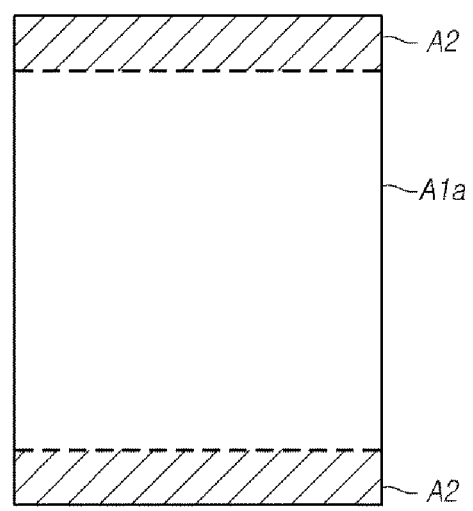

FIG.29
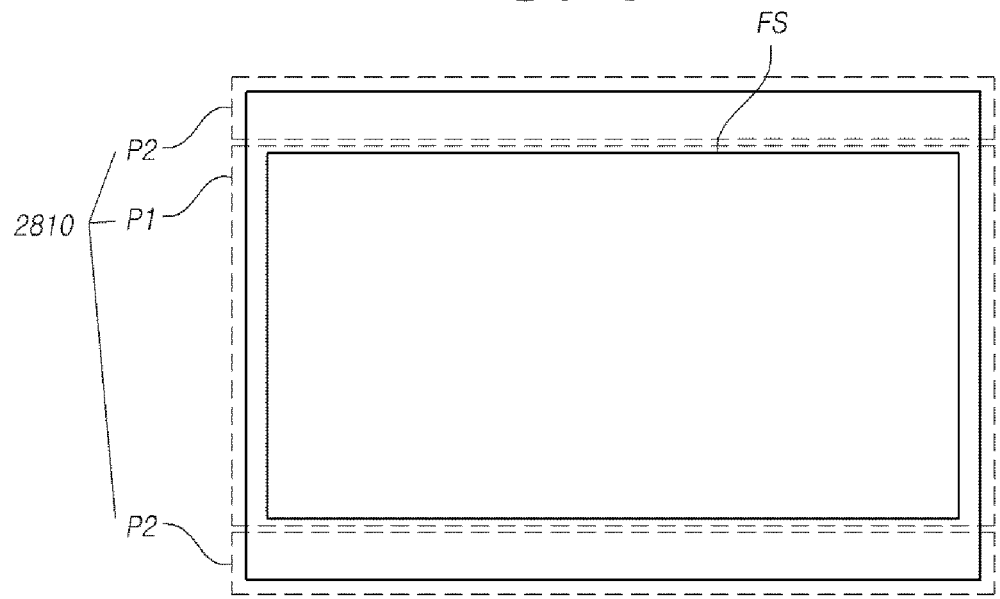
<FRONT>
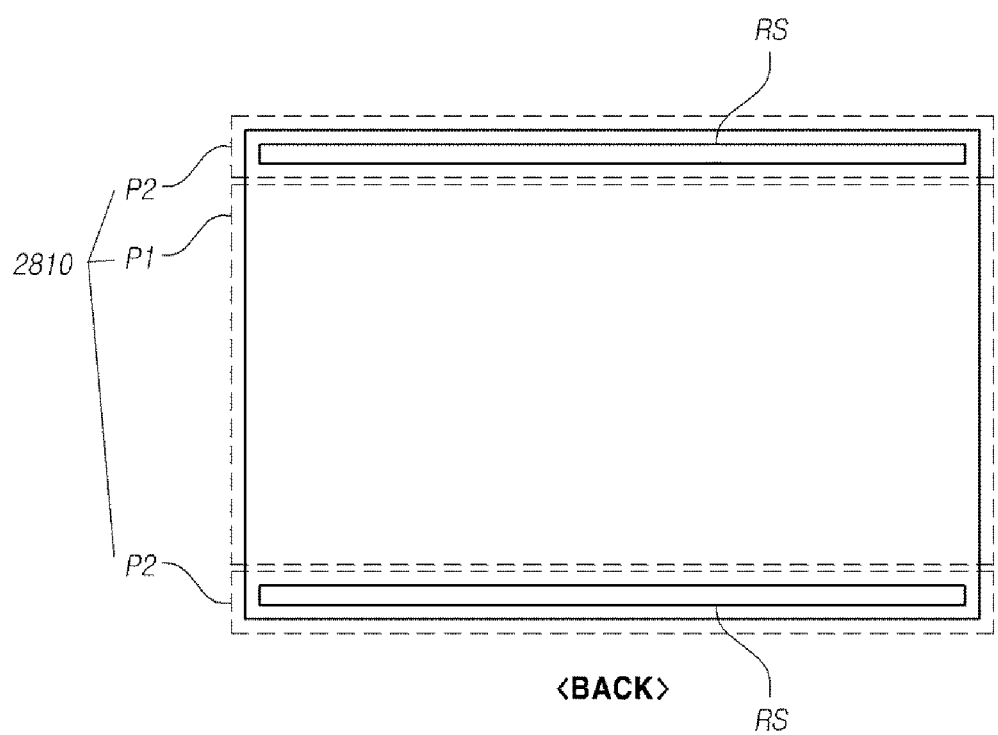
<BACK>

DISPLAY PANEL AND DISPLAY DEVICE

CROSS REFERENCE TO RELATED APPLICATION

This application claims priority from Korean Patent Application Number 10-2015-0146907 filed on Oct. 21, 2015, which is hereby incorporated by reference for all purposes as if fully set forth herein.

BACKGROUND

Field

The present disclosure relates to a display panel and a display device.

Description of Related Art

In response to the development of the information society, the demand for various types of display devices to display images has increased. Recently, a range of display devices, such as liquid crystal display (LCD) devices, plasma display panels (PDPs), and organic light-emitting display devices, are used. In addition, in response to increasing user demands, products for use in double-sided display devices, opposite surfaces thereof being able to emit light, as well as flexible display devices, are also being developed.

However, display technologies that have been developed to date require further development to meet user demands.

SUMMARY

Accordingly, the present invention is directed to a display panel and a display device that substantially obviate one or more of the problems due to limitations and disadvantages of the related art.

An object of the present disclosure is to provide a novel display panel having a double-sided light-emitting structure able to satisfy rapidly-changing user demands and a display device including the same.

Another object of the present disclosure is to provide a display panel divided into two areas having different light-emitting directions and a display device including the same.

Another object of the present disclosure is to provide a display panel having both a top emission structure and a bottom emission structure on a single substrate and a display device including the same.

Another object of the present disclosure is to provide a foldable display panel able to display various types of additional information or images in a folded state and a foldable display device including the same.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display device comprises a display panel having a plurality of data lines and a plurality of gate lines thereon, the display panel including at least one first area and at least one second area having different light-emitting directions; a data driver circuit configured to drive the plurality of data lines; and a gate driver circuit configured to drive the plurality of gate lines.

In another aspect, a display panel comprises a substrate; a first electrode on the substrate; an organic layer on the first electrode; and a second electrode on the organic layer, wherein the display panel includes at least one first area and at least one second area having different light-emitting directions, and wherein the display panel further includes: a bottom reflective layer between the substrate and the first electrode in the first area, and a top reflective layer on the second electrode in the second area.

In another aspect, a display device comprises a body foldable into a plurality of parts; and a driver chip within the body, wherein a front screen is provided on at least one first part among the plurality of parts, and a rear screen is provided on at least one second part among the plurality of parts other than the first part, and wherein, when the display device is folded, the rear screen provided on the at least one second part is exposed externally to display additional information including at least one of characters, symbols, and images.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 12 to FIG. 17 illustrate examples of folding lines of the display panels according to example embodiments of the present invention;

FIG. 28 to FIG. 30 illustrate a mobile device as a product application of a display device in which the display panel according to example embodiments of the present invention is used.

DETAILED DESCRIPTION

Figure 1:
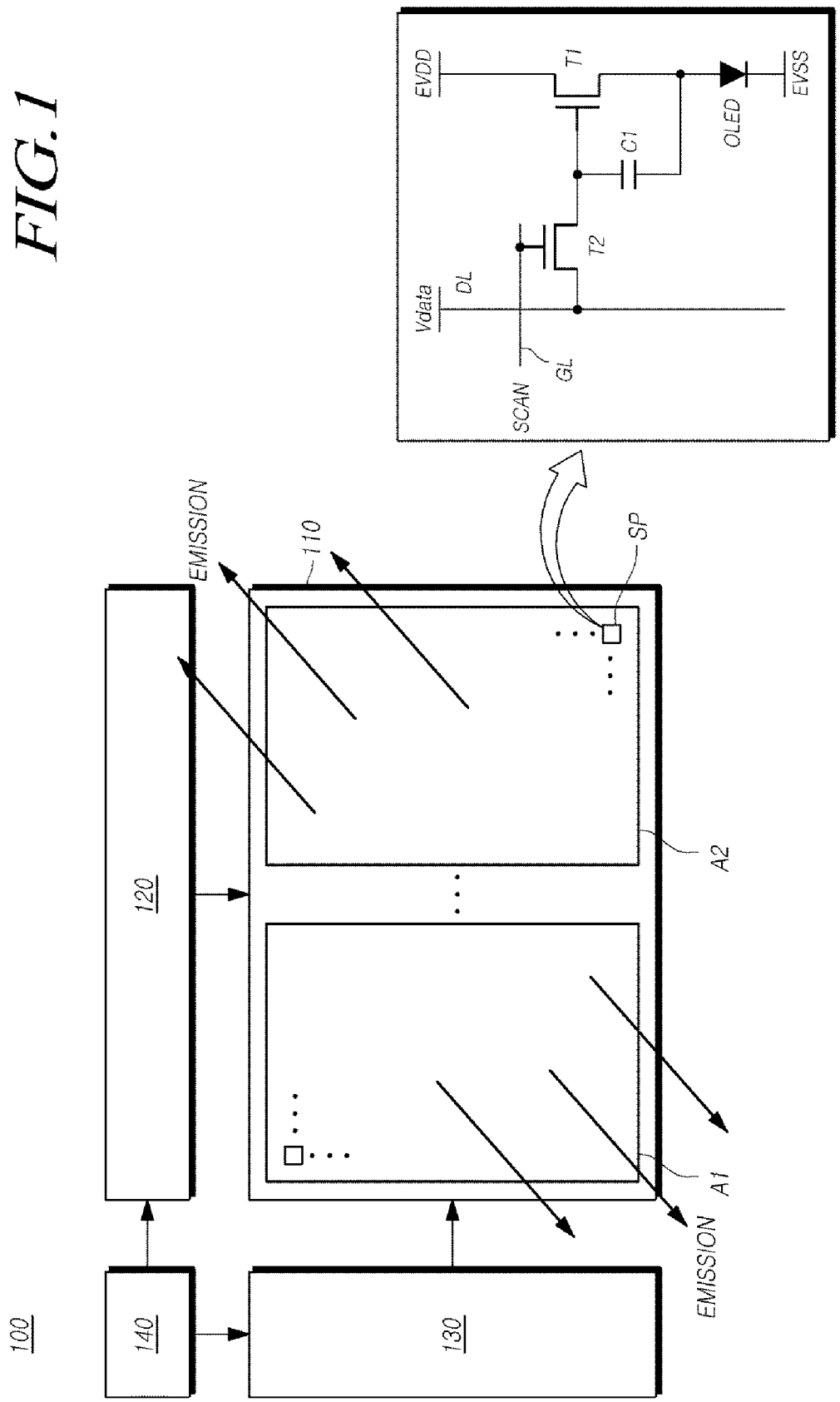
FIG. 1 is a configuration view illustrating a display device according to example embodiments of the present invention.
Figure 2:
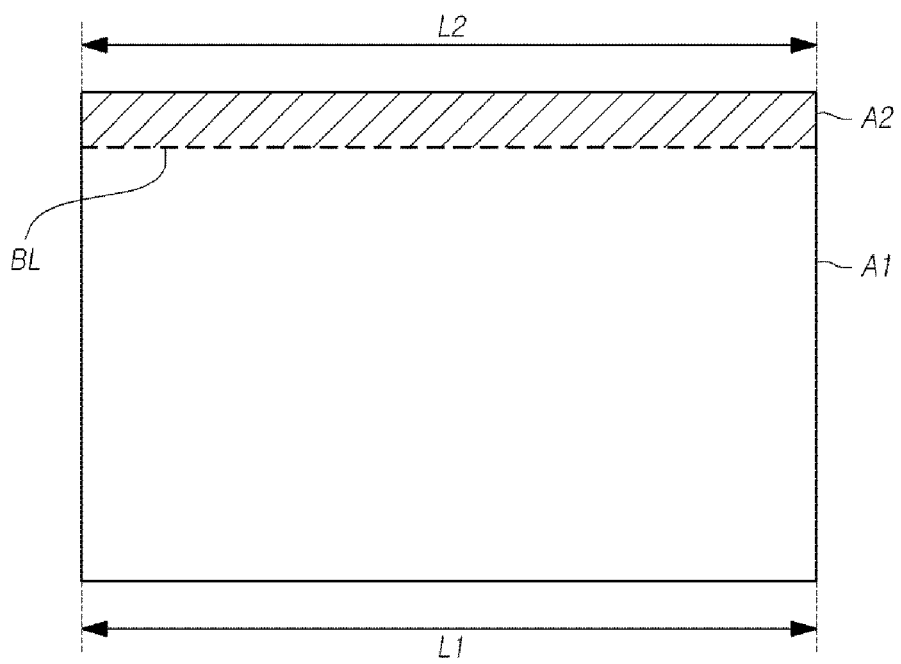
FIG. 2 to FIG. 9 illustrate examples of display panels according to example embodiments of the present invention.
Figure 3:
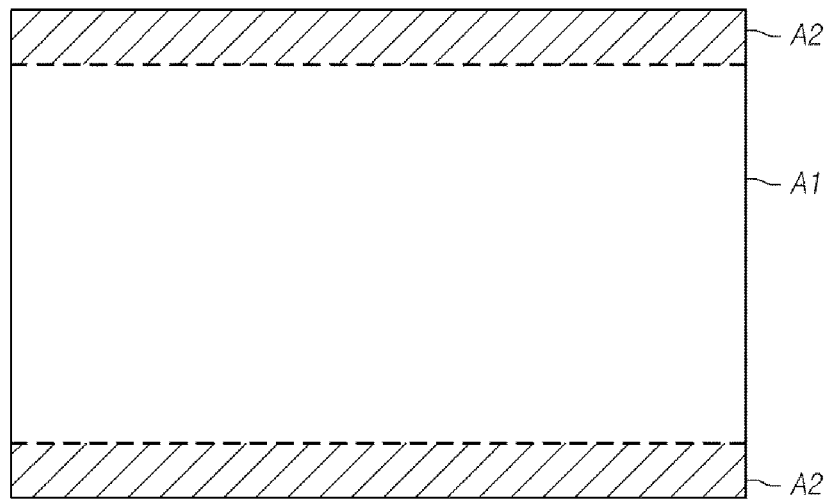
Figure 4:
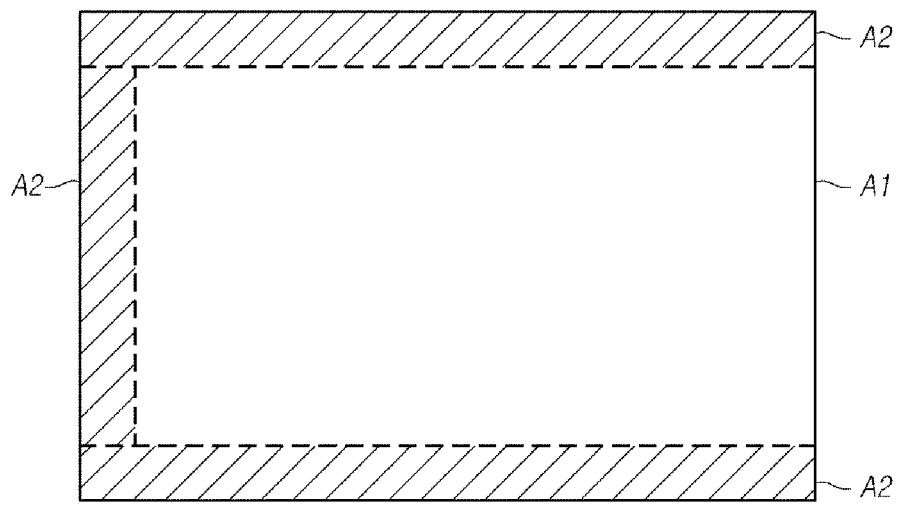

Hereinafter, reference will be made to embodiments of the present disclosure in detail, examples of which are illustrated in the accompanying drawings. Throughout this document, reference should be made to the drawings, in which the same reference numerals and signs will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order or number of these elements is not limited by these terms. It will be understood that when an element is referred to as being "connected to," "coupled to," or "fastened to" another element, not only can it be "directly connected or coupled to" the other element, but it can also be "indirectly connected, coupled, or fastened to" the other element via an "intervening" element.

FIG. 1 is a configuration view illustrating a display device 100 according to example embodiments of the present invention.

With reference to FIG. 1, the display device 100 may include a display panel 110, a data driver circuit 120, a gate driver circuit 130, and a controller 140. The display panel 110 has a plurality of data lines, a plurality of gate lines, and a plurality of subpixels disposed thereon. The data driver circuit 120 drives the plurality of data lines, while the gate driver circuit 130 drives the plurality of gate lines. The controller 140 controls the data driver circuit 120 and the gate driver circuit 130. The controller 140 is able to supply a variety of control signals to the data driver circuit 120 and the gate driver circuit 130 to control the data driver circuit 120 and the gate driver circuit 130. The controller 140 starts scanning based on timing realized by each frame, converts image data input from an external source into a data signal format readable by the data driver circuit 120, outputs the converted image data, and at a suitable point in time, controls data processing in response to the scanning.

The controller 140 may be a timing controller used in display technology or may be a control device including the timing controller and configured to perform other control functions.

The data driver circuit 120 drives the plurality of data lines by converting image data received from the controller 140 into analog data voltages and supplying the analog data voltages to the plurality of data lines. Hereinafter, the data driver circuit 120 will also be referred to as a "source driver."

The gate driver circuit 130 sequentially drives the plurality of gate lines by sequentially supplying scanning signals to the plurality of gate lines. Hereinafter, the gate driver circuit 130 will also be referred to as a "scanning driver." The gate driver circuit 130 sequentially supplies scanning signals, respectively having an on or off voltage, to the plurality of gate lines under the control of the controller 140.

Although the data driver circuit 120 in FIG. 1 is illustrated as being positioned on one side of (e.g., above or below) the display panel 110, the data driver circuit 120 may be positioned on either or both sides of (e.g., above and below) the display panel 110 depending on the driving system, the design of the panel, and so on. The data driver circuit 120 may include the controller 140.

In addition, although the gate driver circuit 130 in FIG. 1 is illustrated as being positioned on one side (e.g., to the left or to the right) of the display panel 110, the gate driver circuit 130 may be positioned on either or both sides (e.g., to the left and to the right) of the display panel 110. The gate driver circuit 130 and the data driver circuit 120 may be integrated to form an integrated driver chip.

The controller 140 receives a variety of timing signals, including a vertical synchronization signal Vsync, a horizontal synchronization signal Hsync, an input data enable (DE) signal, and a clock signal, as well as input image data, from an external source (e.g., an external host system).

The controller 140 not only outputs image data input from an external source by converting the image data into a data signal format readable by the source driver circuit 120, but also receives the variety of received timing signals (including the vertical synchronization signal Vsync, the horizontal synchronization signal Hsync, the input DE signal, and the clock signal), generates a variety of control signals, and outputs the variety of control signals to the source driver circuit 120 and the scanning driver circuit 130 to control the source driver circuit 120 and the scanning driver circuit 130. For example, the controller 140 outputs a variety of gate control signals (GCSs), including a gate start pulse (GSP), a gate shift clock (GSC) signal, and a gate output enable (GOE) signal, to control the scanning driver 130.

Here, the GSP controls the operation start timing of one or more gate driver ICs (GDICs) of the scanning driver circuit 130. The GSC signal is a clock signal commonly input to the GDICs to control the shift timing of scanning signals (gate pulses). The GOE signal designates the timing information of one or more GDICs.

In addition, the controller 140 outputs a variety of data control signals (DCSs), including a source start pulse (SSP), a source sampling clock (SSC) signal, and a source output enable (SOE) signal, to control the source driver circuit 120. Here, the SSP controls the data sampling start timing of one or more SDICs of the source driver circuit 120. The SSC signal is a clock signal controlling the data sampling timing of each of the SDICs. The SOE signal controls the output timing of the source driver circuit 120. The source driver circuit 120 may include one or more source driver ICs (SDICs).

Each of the SDICs may be connected to the bonding pads of the display panel 110 by tape automated bonding (TAB) or chip on glass (COG) bonding, may be directly disposed on the display panel 110, or in some cases, may be integrated with the display panel 110. In addition, each of the SDICs may be mounted on a film connected to the display panel 100 by a chip on film (COF) process. Each of the SDICs may include a shift register, a latch circuit, a digital-to-analog converter (DAC), an output buffer, and so on. In some cases, each of the SDICs may further include an analog-to-digital converter (ADC).

The gate driver circuit 130 may include one or more gate driver integrated circuits (GDICs). Each of the GDICs may be connected to the bonding pads of the display panel 110 by tape automated bonding (TAB) or chip on glass (COG) bonding, may be implemented as a gate in panel (GIP)-type IC directly disposed on the display panel 110, or in some cases, may be integrated with the display panel 110. In addition, each of the GDICs may be mounted on a film connected to the display panel 100 by a chip on film (COF) process. Each of the GDICs may include a shift register, a level shifter, and so on.

The display panel 110 may include at least one source printed circuit board (S-PCB) required to connect at least one SDIC in the circuit and a control printed circuit board (C-PCB) on which control components and a variety electronic devices are mounted. At least one SDIC may be mounted on the at least one S-PCB, or a film on which at least one SDIC is mounted may be connected to the at least one S-PCB.

The controller 140 controlling the operations of the data driver circuit 120 and the gate driver circuit 130 may be mounted on the C-PCB. In addition, a power controller supplying a variety of voltages or currents or controlling a variety of voltages or currents to be supplied to the display panel 110, the data driver circuit 120, the gate driver circuit 130, and the like may be disposed on the C-PCB The at least one S-PCB and the C-PCB may be connected in the circuit via at least one connector. The connector may be implemented as a flexible flat cable (FFC), a flexible printed circuit (FPC), or so on. The at least one S-PCB and the C-PCB may be integrated as a single PCB.

The display panel 110 may be one of various types of devices, such as a liquid crystal display (LCD) device, an organic light-emitting display device, and a plasma display panel (PDP). Each of the subpixels disposed on the display panel 110 may include a circuit device, such as a transistor.

For example, when the display panel 110 is an organic light-emitting display panel, each of the subpixels may include an organic light-emitting diode (OLED), a transistor T1 driving the OLED, a switching transistor T2 delivering a data voltage Vdata to a gate node of the driving transistor T1, a storage capacitor C1 connecting a gate node and a source node (or a drain node) of the driving transistor T1, and so on.

The OLED includes a first electrode, an organic layer, and a second electrode. The first electrode may be an anode or a cathode, while the second electrode may be a cathode or an anode. A base voltage EVSS is connected to the second electrode.

The driving transistor T1 is controlled by the data voltage Vdata applied to the gate node. A driving voltage EVDD is applied to the drain node (or the source node) of the driving transistor T1. The source node (or the drain node) of the driving transistor T1 is connected to the first electrode (the anode or the cathode) of the OLED.

The switching transistor T2 is controlled by a scanning signal SCAN applied to the gate node through the gate line GL. When the switching transistor T2 is turned on by the scanning signal, the switching transistor T2 switches the data voltage Vdata applied to the drain node or the source node through the data line DL to output through the source node or the drain node so that the data voltage Vdata is delivered to the gate node of the driving transistor T1. The storage capacitor C1 maintains a predetermined level of voltage for a single frame.

The types and number of circuit elements constituting each of the subpixels SP may be variously added to or altered depending on the functions to be provided and the design. As shown in FIG. 1, the display panel 110 may be divided into at least one first area A1 and at least one second area A2. The at least one first area A1 and the at least one second area A2 do not overlap each other and have different light-emitting directions.

For example, the first area A1 may have a top emission structure, while the second area A2 may have a bottom emission structure. Alternatively, the first area A1 may have a bottom emission structure, while the second area A2 may have a top emission structure.

In addition, the first area A1 having a top or bottom emission structure may be a front display area, while the second area A2 having a bottom or top emission structure may be a rear display area. Alternatively, the first area A1 may be a rear display area, while the second area A2 may be a front display area.

As described above, the display panel 110 differs from a typical double-sided display panel in that one area A1 or A2 has top emission structure while the other area A2 or A1 has a bottom emission structure.

More specifically, in the case of a typical double-sided display panel, bidirectional light emissions a realized by stacking two display panels configured to emit light in the same direction such that the display panels are oriented in the opposite directions, by patterning light-emitting devices configured to emit light in the same direction in the top and bottom portions of a single substrate, or by patterning a light-emitting device configured to emit in the same direction on one surface of a single substrate and then folding the substrate. In contrast, the display panel 110 according to the present embodiments is configured such that top emissions and bottom emissions are realized separately in the two divided areas A1 and A2.

Thus, the use of the display panel 110 according to the present embodiments can provide new and varied product applications that cannot be created by typical double-sided display panels.

Both the first area A1 and the second area A2 may be image display areas. Alternatively, one of the first area A1 and the second area A2 may be an image display area and the other of the first area A1 and the second area A2 may be an additional information display area.

As described above, new and varied of display devices can be produced using both the first and second areas A1 and A2 as image display areas or one of the first and second areas A1 and A2 as an additional information display area.

Hereinafter, reference will be made to a variety of examples of the display panel 110 designed to be divided by a variety of patterns. That is, the display panel 110 is designed such that various numbers of the first area A1 and the second area A2 are formed at a variety of positions.

FIG. 2 to FIG. 9 illustrate examples of the display panel 110 according to example embodiments of the present invention.

As illustrated in FIG. 2 to FIG. 6 and FIG. 9, the size of the second area A2 may be smaller than the size of the first area A1. Because the second area A2 is set to be smaller than the first area A1 as described above, the display panel 110 may be designed such that the first area A1 is used as a main display area and the second area A2 is used as a sub-display area.

The additional information may include at least one type of information selected from among information regarding the statuses of a variety of devices (e.g., information regarding a battery, communications information, and update information), content information, channel information, news information, weather information, information regarding telecommunications conversation, message information, and so on.

Figure 7:
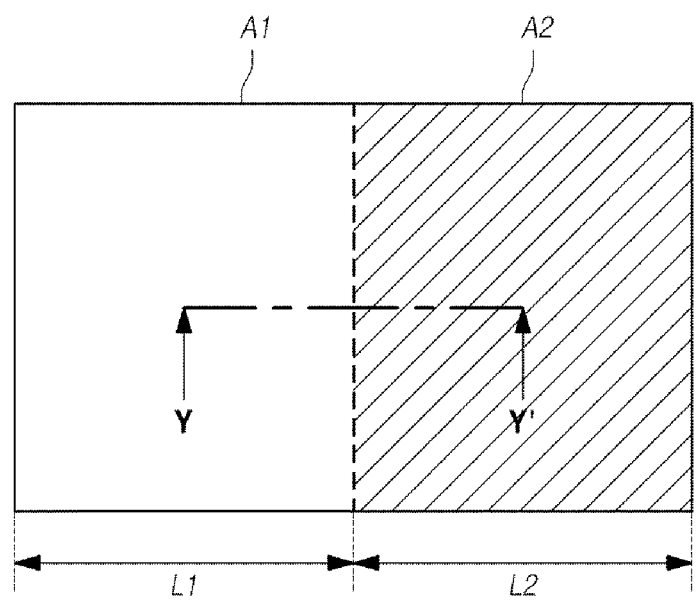
Figure 8:
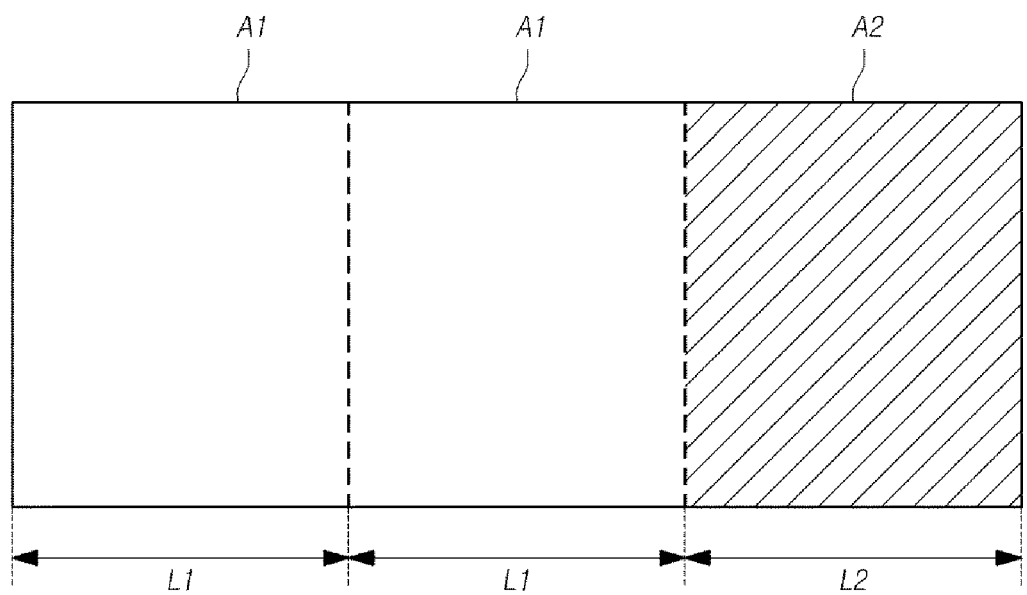

As illustrated in FIGS. 7 and 8, the size of each of the first areas A1 may correspond to the size of each of the second areas A2. That is, a single first area A1 and a single second area A2 may have the same size. Because the single first area A1 and the single second area A2 have the same size as described above, both the first area A1 and the second area A2 can be used as a main display area.

With reference to FIG. 2, FIG. 3, FIG. 7, and FIG. 8, when the direction of the boundary BL between the first area A1 and the second area A2 is referred to as a first direction, the length L2 of the second area A2 in the first direction may correspond to the length L1 of the first area A1 in the first direction.

Based on the length characteristics of the first area A1 and the second area A2 (L1=L2), the display panel 110 in which the first area A1 and the second area A2 have the same length may be used in the development of a variety of new products.

Figure 5:
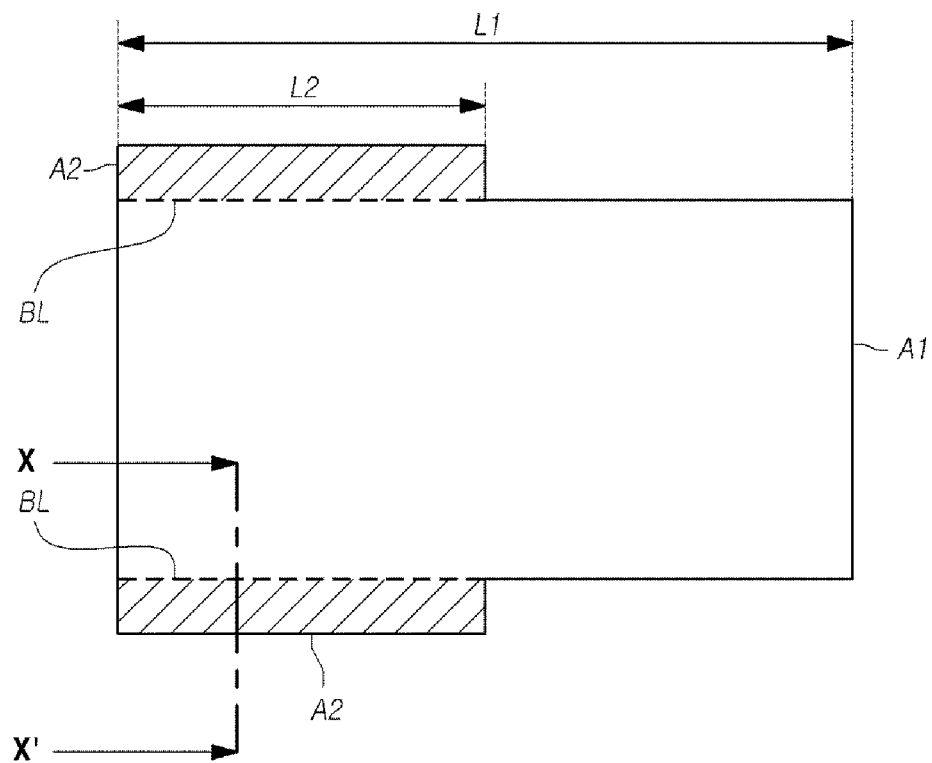
Figure 6:
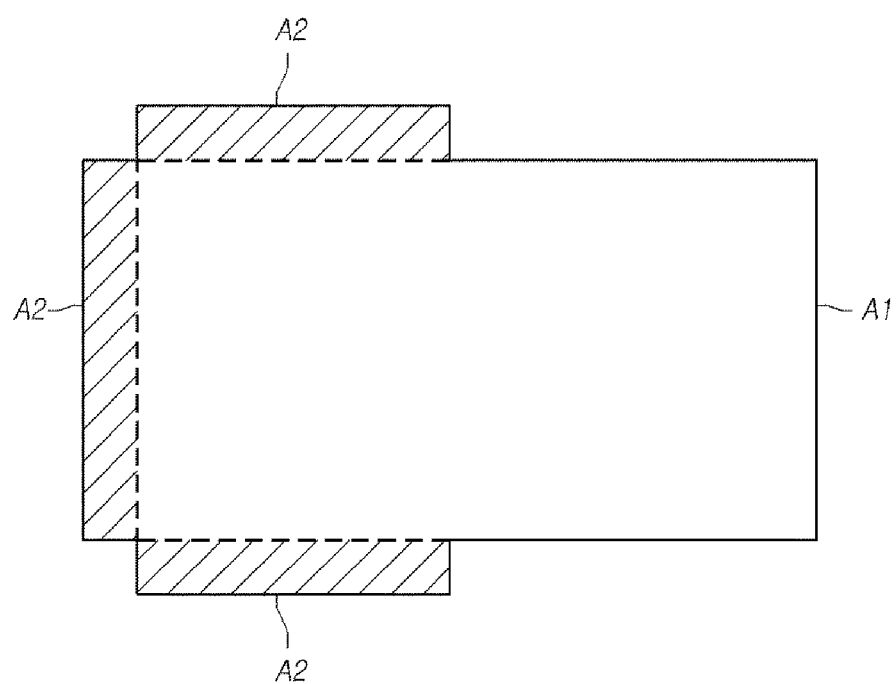

With reference to FIG. 5 and FIG. 6, in the display panel 110, when the direction of the boundary line BL of the first area A1 and the second area A2 is referred to as the first direction, the length L2 of the second area A2 in the first direction may be shorter than the length L1 of the first area A1 in the first direction. Based on the length characteristics of the first area A1 and the second area A2 (L1>L2), the display panel 110 in which the length of the second area A2 is shorter than the length of the first area A1 may be used in the development of a variety of new products.

Figure 9:
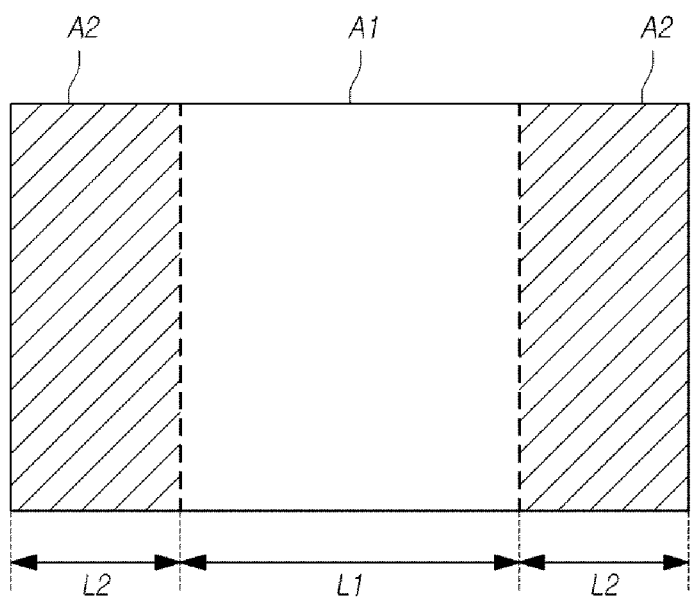

In addition, as illustrated in FIG. 9, the length L2 of each of the second areas A2 in the first direction may be designed to be half the length L1 of the first area A1 in the first direction.

Figure 10:
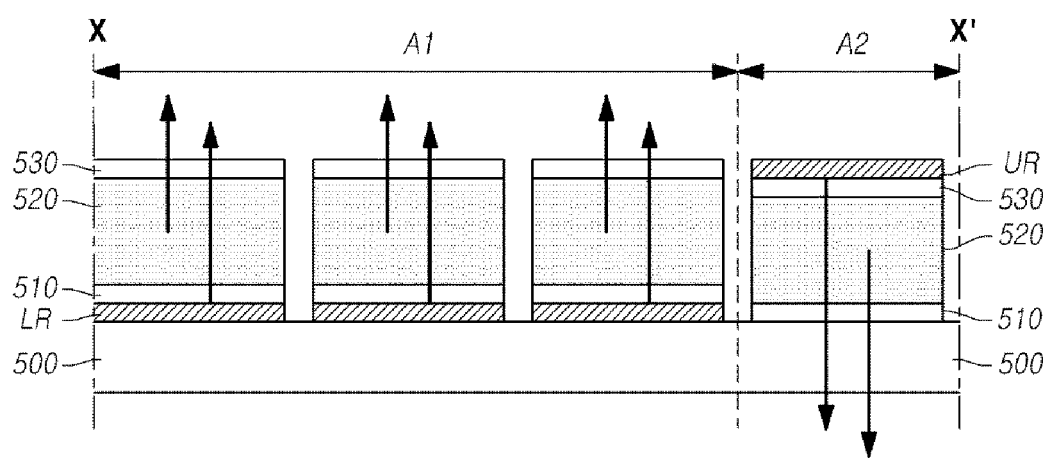
FIG. 10 and FIG. 11 are cross-sectional views of the display panels according to example embodiments of the present invention.
Figure 11:
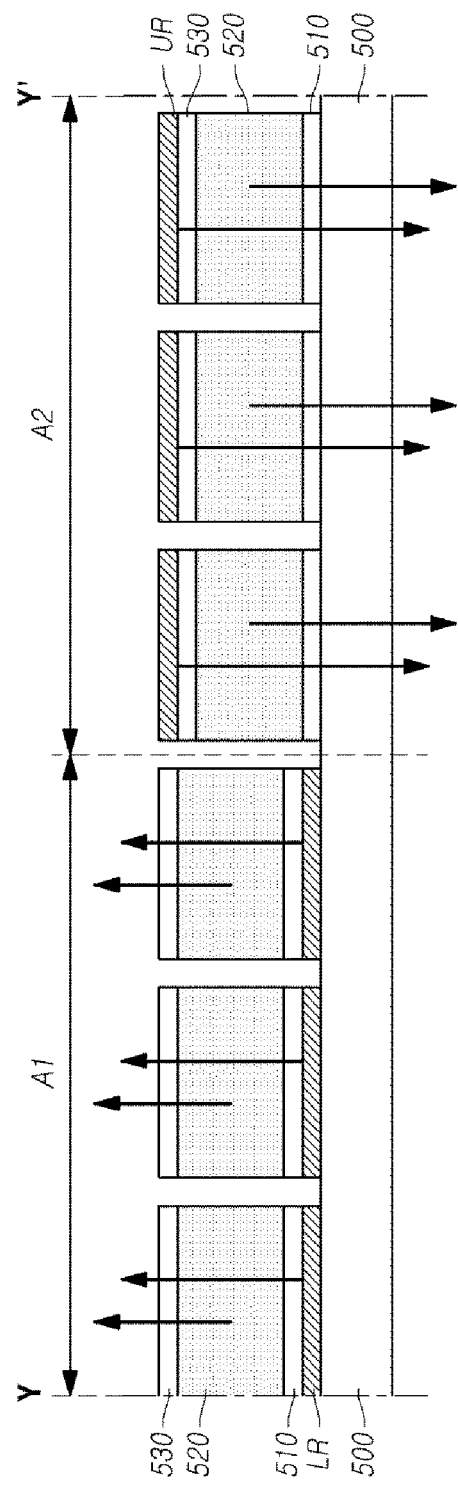

FIG. 10 and FIG. 11 are cross-sectional views of the display panels 110 according to example embodiments of the present embodiments.

FIG. 10 and FIG. 11 illustrate the cross-section taken along line X-X' in FIG. 5 and the cross-section taken along line Y-Y' in FIG. 7 when the display panels 110 are organic light-emitting display panels.

With reference to FIG. 10 and FIG. 11, a multilayer structure is provided in each of the first area A1 and the second area A2. The multilayer structure includes a substrate 500, a first electrode 510 disposed on the substrate 500, an organic layer 520 disposed on the first electrode 510, and a second electrode 530 disposed on the organic layer 520. The first area A1 and the second area A2 have different light-emitting directions.

In this case, a bottom reflective layer LR may be further disposed between the substrate 500 and the first electrode 510 in one of the first area A1 and the second area A2, and a top reflective layer UR may be further disposed on the second electrode 530 in the other of the first area A1 and the second area A2. For example, the first area A1 may be a top emission area, while the second area A2 may be a bottom emission area.

In this case, as illustrated in FIG. 10 and FIG. 11, the bottom reflective layer LR may be further disposed between the substrate 500 and the first electrode 510 in the first area A1, thereby realizing a top emission structure. In addition, the top reflective layer UR may be further disposed on the second electrode 530 in the second area A2, thereby realizing a bottom emission structure.

As illustrated in FIG. 10 and FIG. 11, the bottom reflective layer LR is further disposed between the substrate 500 and the first electrode 510 in one of the first area A1 and the second area A2, and the top reflective layer UR is further disposed on the other of the first area A1 and the second area A2, whereby the first area A1 and the second area A2 can have different light-emitting directions.

With reference to FIG. 10 and FIG. 11, the substrate 500 may be a flexible glass substrate or a flexible film substrate. Here, the flexible film substrate may be, for example, a plastic substrate, a polyimide film, or the like.

A flexible display device can be produced by fabricating the display panel 110 using the above-described substrate 500. The display device 100 according to the present embodiments may be a foldable device.

Hereinafter, a variety of folding patterns of the display panel 110 according to the present embodiments will be illustrated. That is, a variety of folding points FP along which the display device 100 is folded will be illustrated.

FIG. 12 to FIG. 17 illustrate examples of folding lines FP of the display panels 110 according to example embodiments of the present invention.

With reference to FIG. 12 to FIG. 15, each of the display panels 110 can be folded along the folding points FP between the first area A1 and the second area A2. In addition, the display panel 110 can be folded along the folding points FP at which the first area A1 or the second area A2 is divided into two or more sub-areas.

Figure 16:
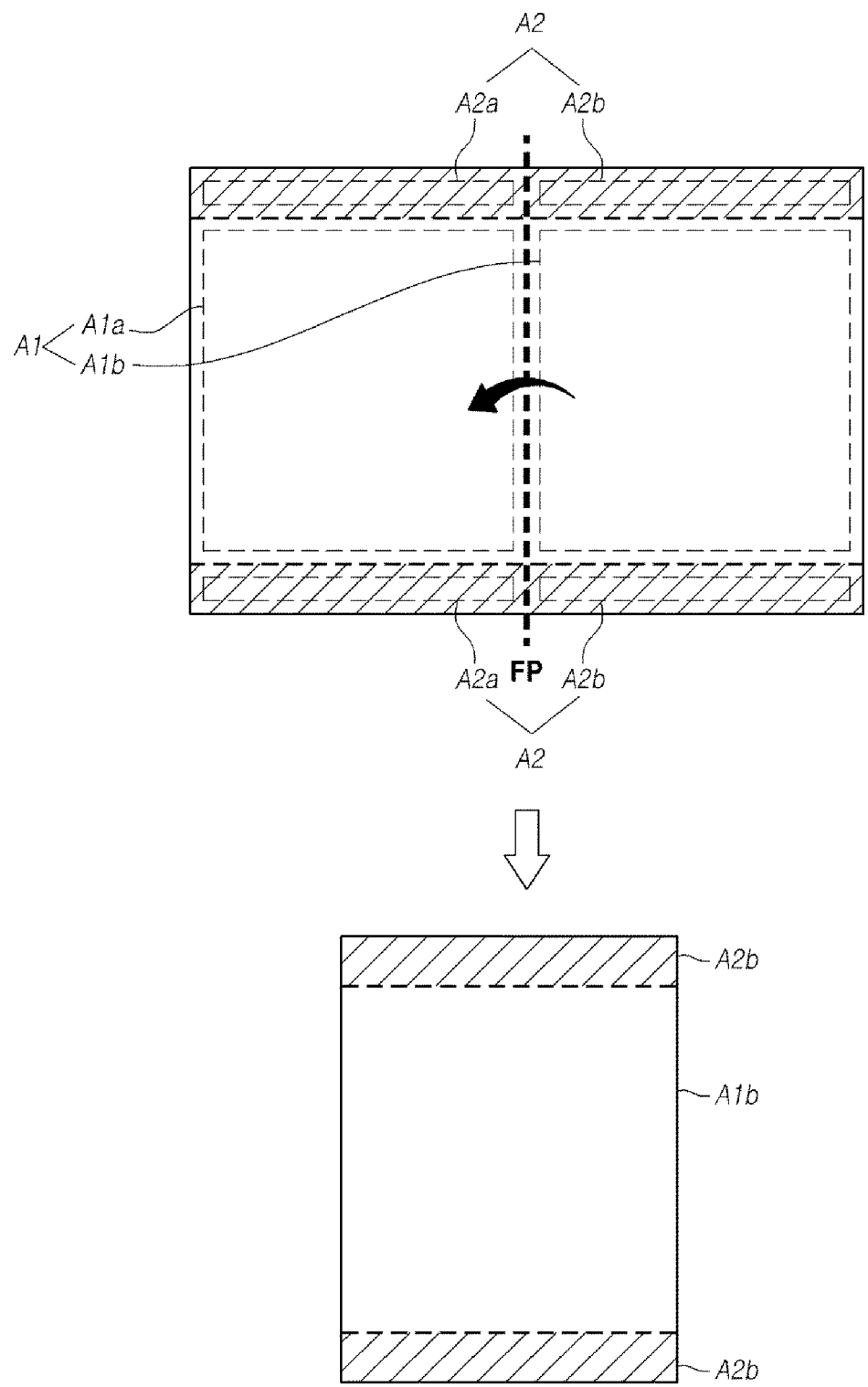

With reference to FIG. 16 and FIG. 17, when the first area A1 is divided into two sub-areas A1a and A1b, the display panel 110 can be folded along the folding points FP between the two sub-areas A1a and A1b.

As illustrated in FIG. 12 to FIG. 15, a folding pattern suitable to the position and size of the divided areas A1 and A2 of the display panel 110 can be provided by folding the display panel 110 along the boundary between the first area A1 and the second area A2 or along points by which the first or second area A1 or A2 is divided into two or more sub-areas.

With reference to FIG. 12 to FIG. 15, when the display panel 110 is folded along the boundary between the first area A1 and the second area A2, the second area A2 can cover all or a portion of the first area A1.

In the case of FIG. 12 and FIG. 13, when the display panel 110 is folded along the folding points FP between the first area A1 and the second areas A2, portions of the first area A1 are covered with the second areas A2 such that the portions are not externally exposed. Thus, the rear surfaces of the second areas A2 act as covers to conceal portions of the first area A1.

In the case of FIG. 14 and FIG. 15, when the display panel 110 is folded along the folding points FP between the first area A1 and the second areas A2, the first area A1 is entirely covered with the second area A2 such that the first area A1 is not externally exposed. That is, the rear surfaces of the second area A2 act as covers to conceal the entirety of the first area A1.

When the display panel 110 is folded along the folding points FP between the first area A1 and the second areas A2 as in FIG. 12 to FIG. 15, the second areas A2 can act as covers to close all or portions of the first area A1.

With reference to FIG. 16 and FIG. 17, when the display panel 110 is folded along the points by which a single first area A1 is divided into two sub-areas A1a and A1b, at least one of the two or more sub-areas A1a and A1b can cover the other of the two or more sub-areas A1a and A1b.

With reference to FIG. 16, the single first area A1 is divided into the two sub-areas A1a and A1b, and each of the two sub-areas A2 is divided into two sub-areas A2a and A2b. When the right part of the display panel is folded to the left, the left sub-area A1a of the first area A1 is covered with the right sub-area A1b of the first area A1, and the left sub-areas A2a of the second areas A2 are covered with the right sub-areas A2b of the second areas A2.

As shown in FIG. 17, the single first area A1 is divided into the two sub-areas A1a and A1b. When the left part of the display panel is folded to the right, the right sub-area A1b of the first area A1 is covered with the left sub-area A1a of the first area A1.

As illustrated in FIG. 16 and FIG. 17, when the display panel 110 is folded along the points by which the single first area A1 is divided into the two more sub-areas A1*a* and A1*b*, at least one sub-area A1*b* or A1*a* can cover the other sub-area A1*a* or A1*b*.

Figure 18:
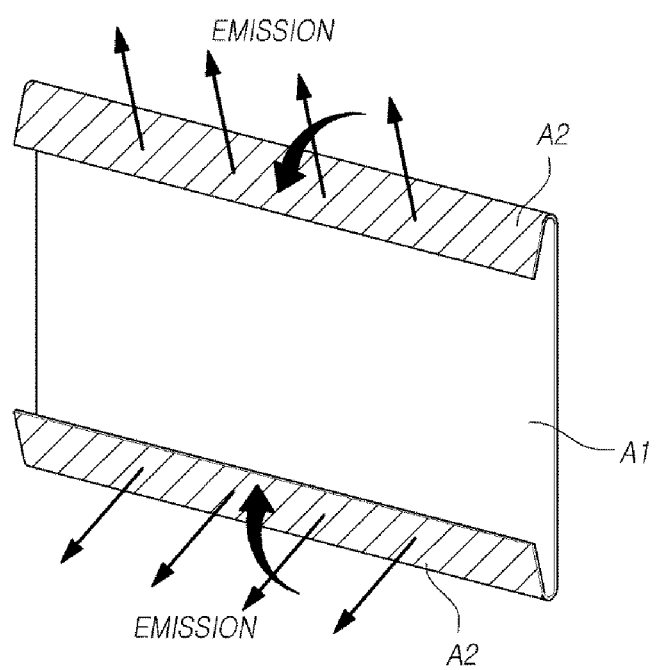
FIG. 18 to FIG. 22 illustrate the folded states of the display panels according to example embodiments of the present invention.
Figure 19:
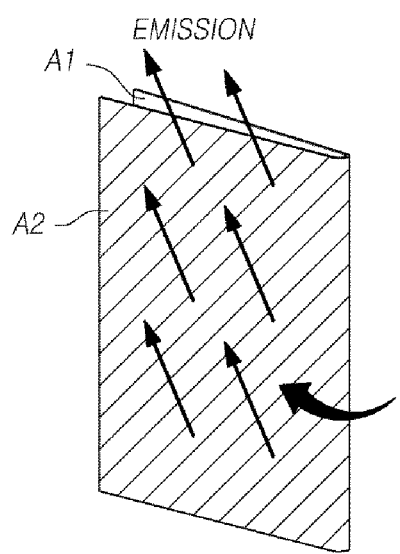
Figure 20:
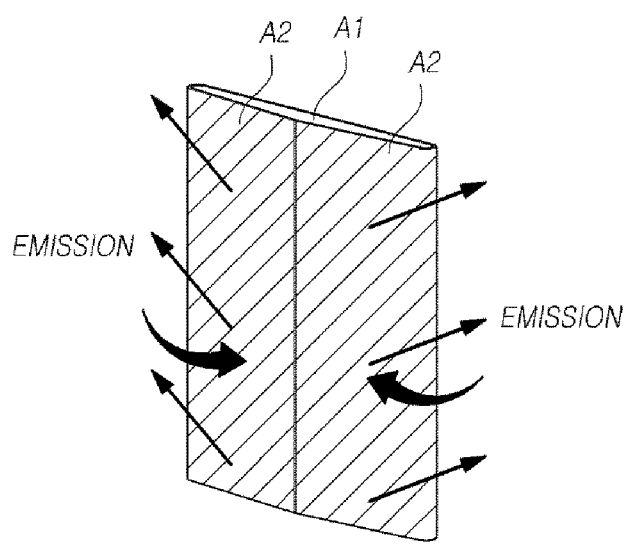
Figure 21:
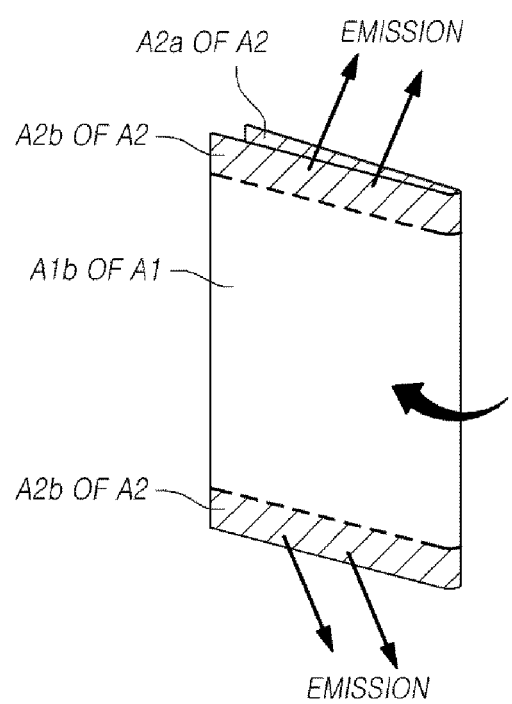
Figure 22:
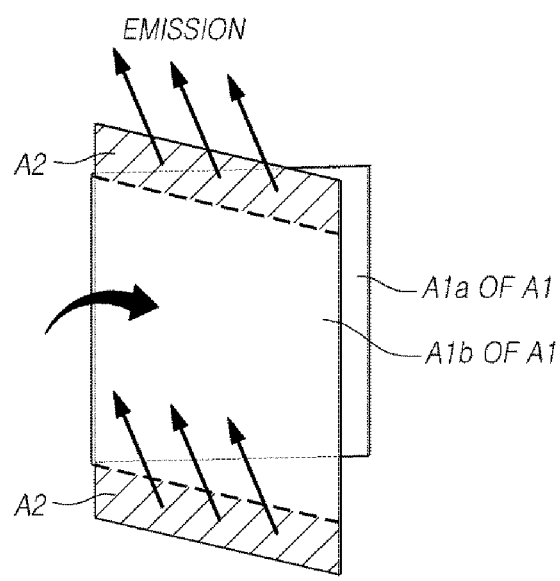

FIG. 18 to FIG. 22 illustrate the folded states of the display panels 110 according to example embodiments of the present invention. FIG. 18 to FIG. 20 illustrate the display panels 110 illustrated in FIG. 12, FIG. 14, and FIG. 15, which are emitting light in the folded states. FIG. 21 and FIG. 22 illustrate the display panels 110 illustrated in FIG. 16 and FIG. 17, which are emitting light in the folded states.

As shown in FIG. 18 to FIG. 22, when each of the display panels 110 is folded, one area A1 or A2 of the first area A1 and the second area A2 may be a display-on area (e.g., an area that is being display-driven), and the other area A2 or A1 of the first area A1 and the second area A2 may be a display-off area (e.g., an area that is not being display-driven).

With reference to FIG. 18 to FIG. 20, when each of the display panels 110 is folded along the boundaries between the first area A1 and the second areas A2, the first area A1 is covered with the rear surfaces of the second areas A2. When the first area A1 is a top emission area and the second area A2 is a bottom emission area, the front surface of the first area A1, e.g., the light-emitting surface, does not generate light, and the second areas A2 covering the first area A1 emit light through the rear surfaces, e.g., the light-emitting surfaces, due to the bottom emission structure thereof.

Thus, various types of additional information and so on may be displayed through the second area A2 when the display panel 110 is folded.

As described above, when the display panel 110 is folded along the boundary between the two divided sub-areas A1*a* and A1*b* of the first area A1, one sub-area A1*a* or A1*b* of the first area A1 covers the other sub-area A1*b* or A1*a* of the first area A1.

With reference to FIG. 21 illustrating the folded state of the display panel illustrated in FIG. 16, the single first area A1 is divided into the two sub-areas A1*a* and A1*b*, and each of the two second areas A2 is divided into the two sub-areas A2*a* and A2*b*. When the right part of display panel is folded to the left, the right sub-area A1*b* of the first area A1 covers the left sub-area A1a of the first area A1, and the right sub-areas A2*b* of the second areas A2 cover the left sub-areas A2*a* of the second areas A2.

When the first area A1 is a top emission area and the second area A2 is a bottom emission area, the front surface of the first area A1 corresponding to the emission surface does not generate light, while the right sub-areas A2*b* of the second areas A2 covering the left sub-areas A2*a* of the second areas A2 emit light through the rear surfaces, e.g., the light-emitting surfaces, due to the bottom emission structure thereof.

With reference to FIG. 22 illustrating the folded state of the display panel illustrated in FIG. 17, the single first area A1 is divided into the two sub-areas A1*a* and A1*b*. When the left part of display panel is folded to the right, the left sub-area A1a of the first area A1 covers the right sub-area A1*b* of the first area A1.

Here, the second areas A2 having the bottom emission structure emit light through the rear surfaces, e.g., the light-emitting surfaces.

As illustrated in FIG. 18 to FIG. 22, a user can check various types of additional information from the second areas A2, which emit light through bottom emissions, without unfolding (e.g., opening) the folded display panel 110.

Figure 23:
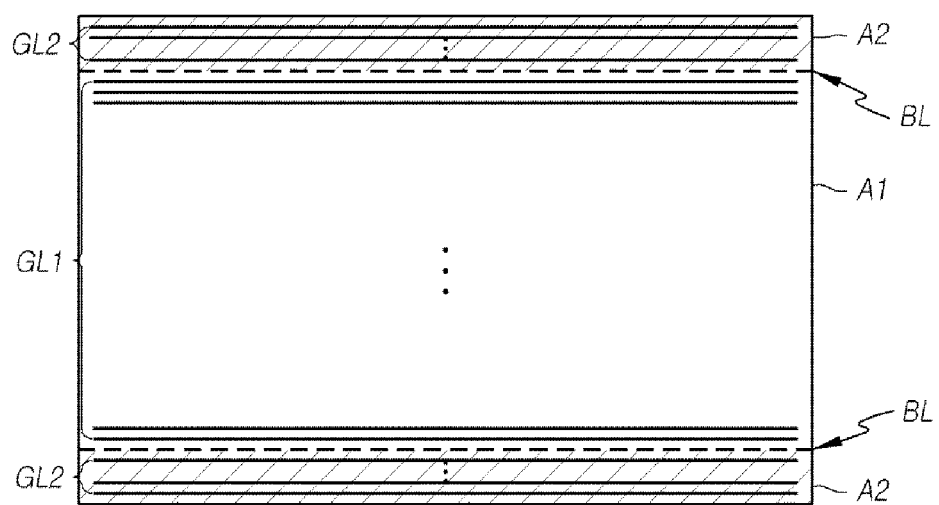
FIG. 23 illustrates gate lines on the display panel according to example embodiments of the present invention.

FIG. 23 illustrates gate lines GL1 and GL2 on the display panel 110 according to example embodiments of the present invention.

In FIG. 23, the boundaries BL between the first area A1 and the second areas A2 are parallel to the gate lines GL1 and GL2. For example, the gate lines GL1 disposed in the first area A1 and the gate lines disposed in the second areas A2 are parallel to the boundaries BL between the first area A1 and the second areas A2.

When the first area A1 and the second areas A2 are disposed such that the boundaries BL between the first area A1 and the second areas A2 are parallel to the gate lines GL1 and GL2, the display panels 110 as illustrated in FIG. 2 to FIG. 6 can be fabricated.

In addition, when the first area A1 and the second areas A2 are disposed such that the boundaries therebetween are parallel to the gate lines GL1 and GL2, it may be convenient to independently perform gate driving over the first area A1 and the second areas A2. Consequently, it may be easy to independently control the display statuses of the first area A1 and the second areas A2.

For example, when only the gate lines GL1 disposed on the first area A1 are sequentially driven, gate driving can be controlled to be performed only on the first area A1 so that only the first area A1 is display-driven. In contrast, when only the gate lines GL2 disposed on the second areas A2 are sequentially driven, gate driving can be controlled to be performed only on the second area A2 so that only the second area A2 is display-driven.

Figure 24:
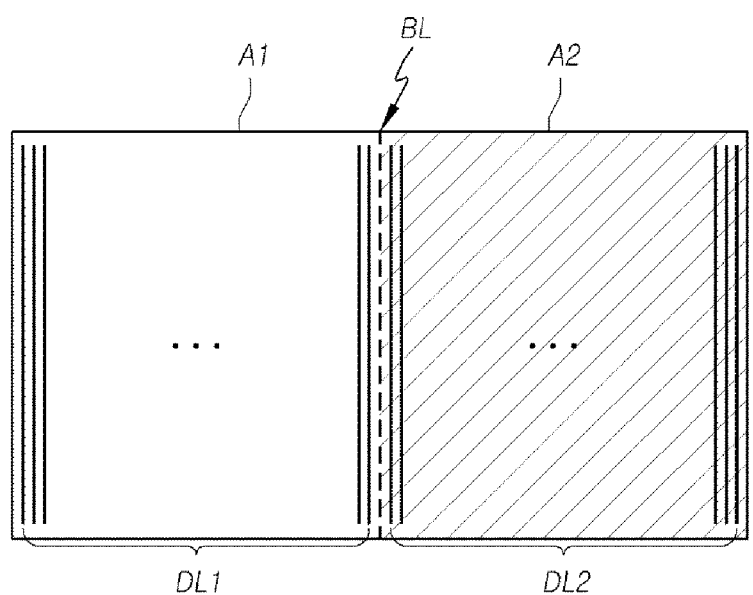
FIG. 24 illustrates data lines on the display panel according to example embodiments of the present invention.

FIG. 24 illustrates data lines DL1 and DL2 on the display panel 110 according to example embodiments of the present invention.

In FIG. 24, the boundary BL between the first area A1 and the second area A2 of the display panel 110 is parallel to the data lines DL1 and DL2. For example, the data lines DL1 in the first area A1, and the data lines DL2 in the second area A2 are parallel to the boundary BL between the first area A1 and the second area A2.

When the first area A1 and the second areas A2 are disposed such that the boundary BL therebetween is parallel to the data lines DL1 and DL2, the display panels 110 as illustrated in FIG. 7 to FIG. 9 can be fabricated. In addition, when the first area A1 and the second areas A2 are disposed such that the boundary BL therebetween is parallel to the data lines DL1 and DL2, it may be convenient to independently perform data driving on the first area A1 and the second area A2. It may thereby be convenient to independently control display driving on the first area and the second area A2.

For example, when only the data lines DL1 disposed in the first area A1 are sequentially driven, data driving can be controlled to be performed only on the first area A1 so that only the first area A1 is display-driven. In contrast, when the data lines DL2 disposed in the second area A2 are sequentially driven, data driving can be controlled to be performed only on the second area A2 so that only the second area A2 is display-driven.

As described above, the display panel 110 is divided into at least one first area A1 and at least one second area A2, wherein the divided areas A1 and A2 can be gate-driven independently or can be gate-driven without being distinguished from each other. In addition, the divided areas A1 and A2 in the display panel 110 can be data-driven independently or can be data-driven without being distinguished from each other.

Figure 25:
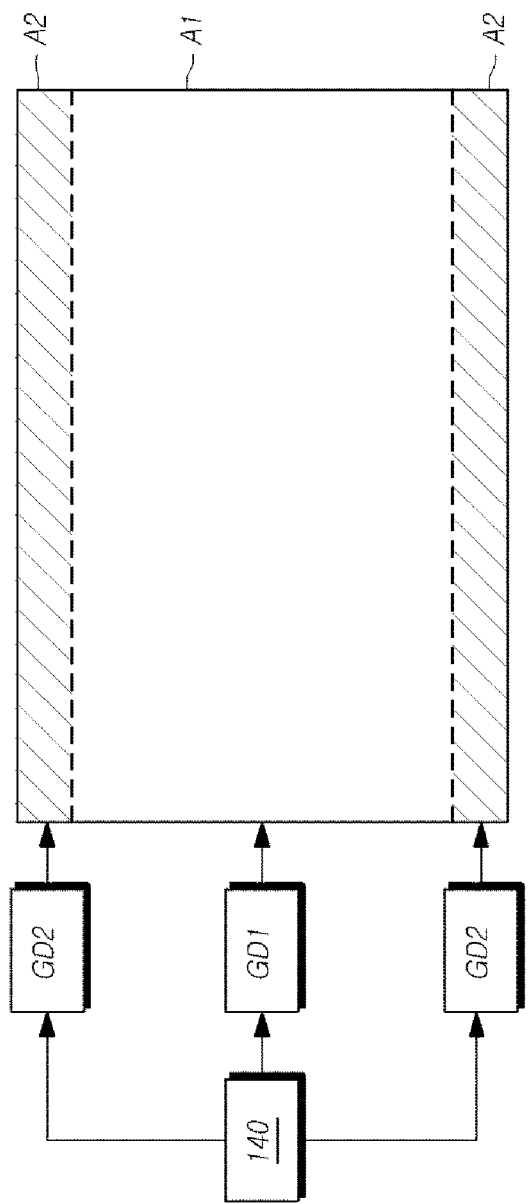
FIG. 25 illustrates a gate driving performed on the first area and the second area of the display panel according to example embodiments of the present invention.
Figure 26:
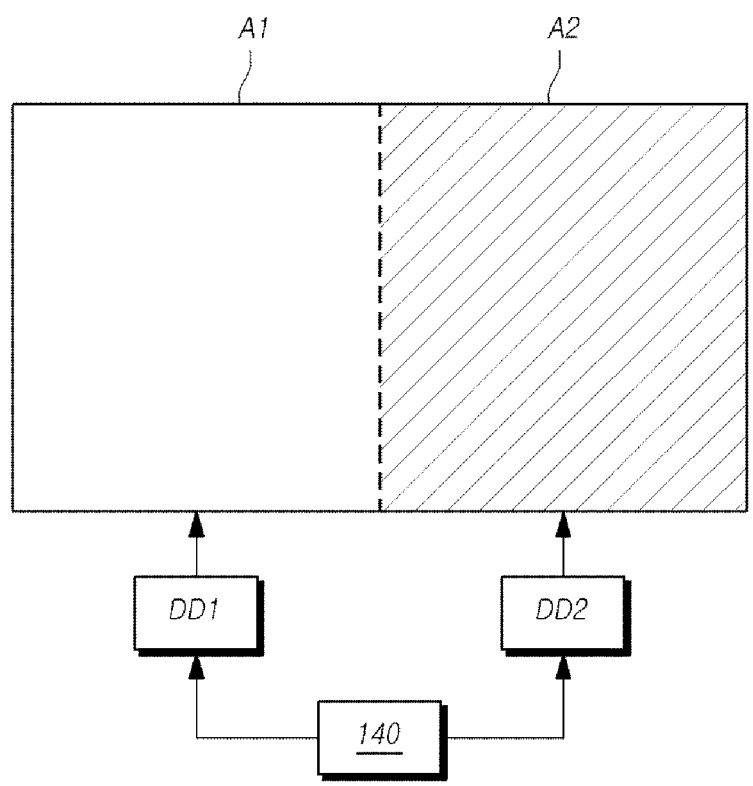
FIG. 26 illustrates a data driving performed on the first area and the second area of the display panel according to example embodiments of the present invention.

The gate driver circuit 130 and the data driver circuit 120 may be configured as illustrated in FIG. 25 and FIG. 26.

FIG. 25 illustrates gate driving performed on the first area A1 and the second area A2 of the display panel 110 according to example embodiments of the present invention.

With reference to FIG. 25, the gate driver circuit 130 of the display device 100 may include a first gate driver GD1 driving gate lines through which subpixels disposed in the first area A1 are controlled to generate light and a second gate driver GD2 driving gate lines through which subpixels disposed in the second area A2 are controlled to generate light.

For example, as illustrated in FIG. 10 and FIG. 11, the subpixels disposed in the first area A1 may have a top emission structure, while the subpixels disposed in the second area A2 may have a bottom emission structure.

When the gate driver circuit 130 includes the gate drivers GD1 and GD2, each of which drives the corresponding area, as described above, the first area A1 and the second area A2 can be independently gate-driven. Consequently, it may be convenient to control the display statuses of the first area A1 and the second area A2 independently.

For example, when the first gate driver GD1 sequentially drives only the gate lines GL1 disposed in the first area A1, gate driving can be controlled to be performed so that only the first area A1 is display-driven. In contrast, when the second gate driver GD2 sequentially drives only the gate lines GL2 disposed in the second area A2, gate driving can be controlled to be performed so that only the second area A2 is display-driven.

The controller 140 can control the operations of the first gate driver GD1 and the second gate driver GD2 based on the status of the device, such as whether or not the display panel is folded, the positions of the areas, or so on.

FIG. 26 illustrates data driving performed on the first area A1 and the second area A2 of the display panel 110 according to example embodiments of the present invention.

With reference to FIG. 26, the data driver circuit 120 of the display device 100 according to example embodiments of the present invention includes a first data driver DD1 driving data lines through which subpixels disposed in the first area A1 are controlled to generate light and a second data driver DD2 driving data lines through which subpixels disposed in the second area A2 are controlled to generate light.

For example, as illustrated in FIG. 10 and FIG. 11, the subpixels disposed in the first area A1 may have a top emission structure, while the subpixels disposed in the second area A2 may have a bottom emission structure.

When the data driver circuit 120 includes the data drivers DD1 and DD2, each of which drives the corresponding area, as described above, the first area A1 and the second area A2 can be independently data-driven. Consequently, it may be convenient to control the display statuses of the first area A1 and the second area A2 independently.

For example, when the first data driver DD1 sequentially drives only the gate lines DL1 disposed in the first area A1, data driving can be controlled to be performed so that only the first area A1 is display-driven. In contrast, when the second data driver DD2 sequentially drives only the data lines DL2 disposed in the second area A2, data driving can be controlled to be performed so that only the second area A2 is display-driven.

The controller 140 can control the operations of the first data driver DD1 and the second data driver DD2 based on the status of the device such as whether or not the display panel is folded, the positions of the areas, or so on.

As described above, the display panel 110 is divided into the at least one first area A1 and the at least one second area A2. When one area (e.g., the second area A2) of the first area A1 and the second area A2 is an additional information display area (e.g., a sub-display area) in which additional information rather than images is displayed, the additional information display area is not required to be a high-resolution area, unlike an image display area (e.g., a main display area).

Thus, one area of the first area A1 and the second area A2, corresponding to the additional information display area (e.g., the sub-display area), may be a lower-resolution area compared to the other area, although the resolution of one area may be equal to that of the other area. Here, the gate lines and the data lines are disposed such that the number (or density) of the sub-pixels of the lower-resolution area is smaller than that of the sub-pixels of higher-resolution area.

As described above, one area of the first area A1 and the second area A2, corresponding to the additional information display area (e.g., the sub-display area), may be designed to be a lower-resolution area, such that patterns can be designed more easily.

However, as described above, when one area of the first area A1 and the second area A2, corresponding to the additional information display area (e.g., the sub-display area), is designed to be a lower-resolution area compared to the other area, the first area A1 and the second area A2 can be gate-driven and data-driven independently.

Hereinafter, the above-described display panel 110 according to example embodiments of the present invention will be briefly described.

Figure 27:
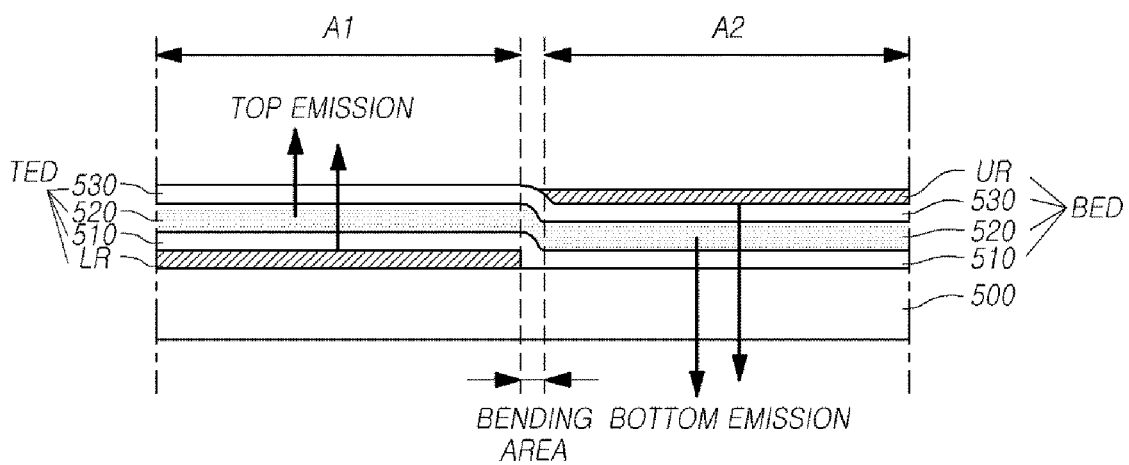
FIG. 27 is a cross-sectional view of the display panel according to example embodiments of the present invention.

FIG. 27 is a cross-sectional view of the display panel 110 according to example embodiments of the present invention.

As shown in FIG. 27, the display panel 110 may include a substrate 500, a top emission device TED disposed in the first area A1 of the substrate 500, and a bottom emission device BED disposed in the second area A2 of the substrate 500.

The top emission device TED and the bottom emission device BED are positioned on the same substrate 500. In addition, circuit elements, such as transistors, (e.g., T1, T2, C1, and so on) are disposed on the substrate 500.

For example, in accordance with FIG. 27, the display panel 110 may include the substrate 500, a first electrode 510 disposed on the substrate 500, an organic layer 520 disposed on the first electrode 510, and a second electrode 530 disposed on the organic layer 520. The first electrode 510 may be an anode of an organic light-emitting diode (OLED), while the second electrode 530 may be a cathode of the OLED. The first electrode 510 and the second electrode 530 may be transparent electrodes or thin-metal electrodes that are thin enough to be transparent.

The display panel 110 is divided into at least one first area A1 and at least one second area A2. In addition, the at least one first area A1 and the at least one second area A2 have different light-emitting directions, the display panel 110 further includes a bottom reflective layer LR disposed between the substrate 500 and the first electrode 510 in the first area A1 and a top reflective UR disposed on the second electrode 530 in the second area A2.

As described above, the novel display panel 110 having a double-sided light-emitting structure can be realized by dividing the single display panel 110 into at least one first area A1 and at least one second area A2 and forming the at least one first area A1 and the at least one second area A2 formed on the same substrate 500 to have a top emission structure and a bottom emission structure. Accordingly, new and varied product applications that cannot be created by typical double-sided display panels can be provided.

Hereinafter, reference will be made to product applications of the display device 100 according to example embodiments of the present invention.

Figure 28:
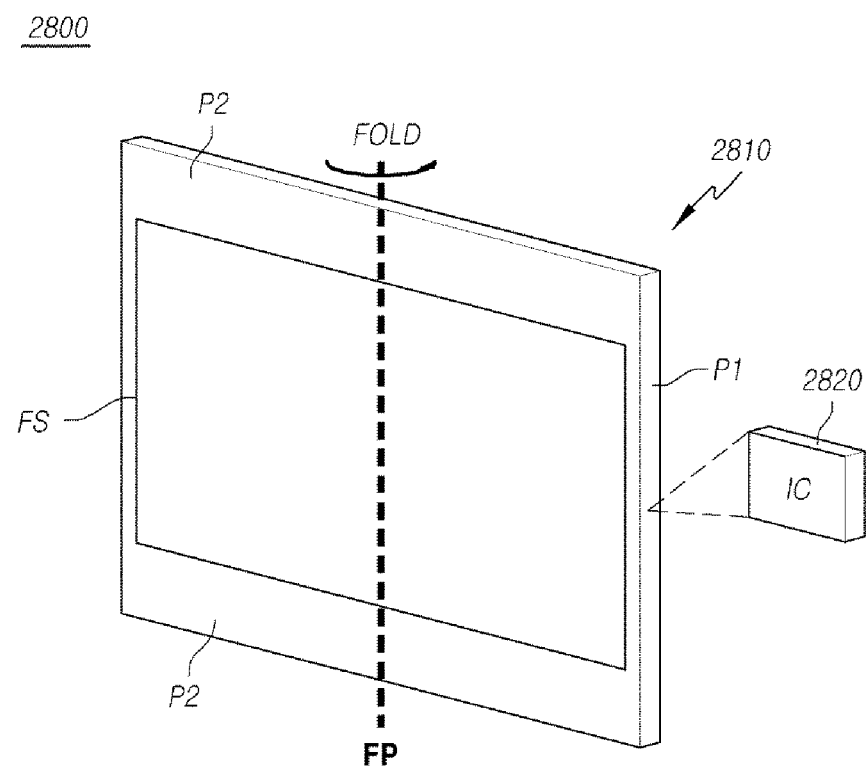
Figure 30:
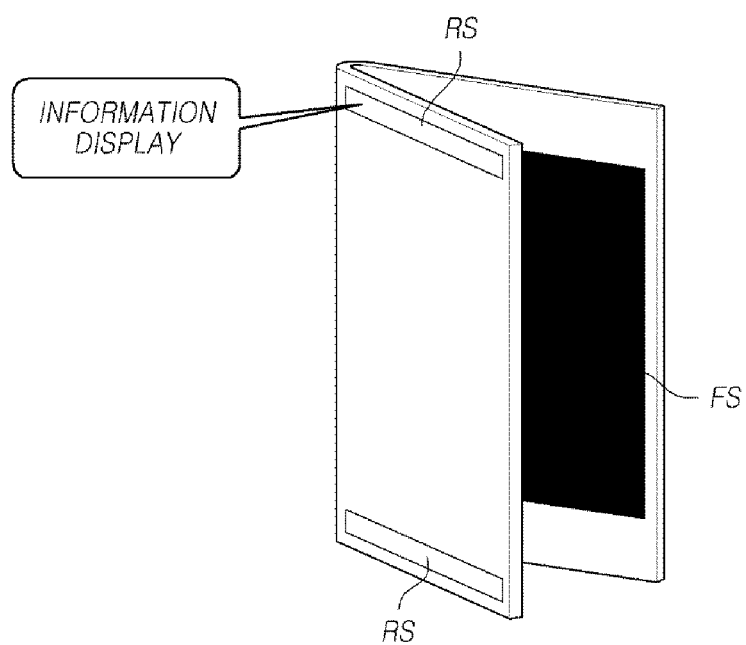

FIG. 28 to FIG. 30 illustrate a mobile device 2800 as a product application of a display device 2800 in which the display panel 110 according to example embodiments of the present invention is used.

In FIG. 28 and FIG. 29, the mobile device 2800 using the display panel 110 includes a body 2810 foldable into a plurality of parts P1 and P2 and a driver chip 2820 disposed within the body 2810.

With reference to FIG. 28 and FIG. 29, at least one first part P1 of the plurality of parts P1 and P2 has a front screen FS, and at least one of second parts P2 of the plurality of parts P1 and P2 has a rear screen RS.

With reference to FIG. 28 to FIG. 30, in the position in which the mobile device 2800, a product application of the display device 100, is folded, the front screen FS is folded to be completely concealed, while the rear screens RS disposed on the second parts P2 may display additional information, including at least one of characters, symbols, and images, thereon. The light-emitting direction of the front screen FS differs from that of the rear screens RS. Thus, the front screen FS corresponds to the first area A1, in which the bottom emission device BED or the top emission device TED is disposed in every subpixel on the substrate 500. In addition, the rear screens RS correspond to the second areas A2, in which the bottom emission device BED or the top emission device TED is disposed in every subpixel on the substrate 500.

The top emission device TED includes the bottom reflective layer LR disposed on the substrate 500, the first electrode 510 disposed on the bottom reflective layer LR, the organic layer 520 disposed on the first electrode 520, the second electrode 530 disposed on the organic layer 520, and so on. The bottom emission device BED includes the first electrode 510 disposed on the substrate 500, the organic layer 520 disposed on the first electrode 510, the second electrode 530 disposed on the organic layer 520, and the top reflective layer UR disposed on the second electrode 530.

The mobile device 2800 is foldable to protect the front screen FS corresponding to a main display screen. In the folded state, various types of additional information may be displayed on the rear screens RS respectively designed to have a bottom emission structure.

Figure 31:
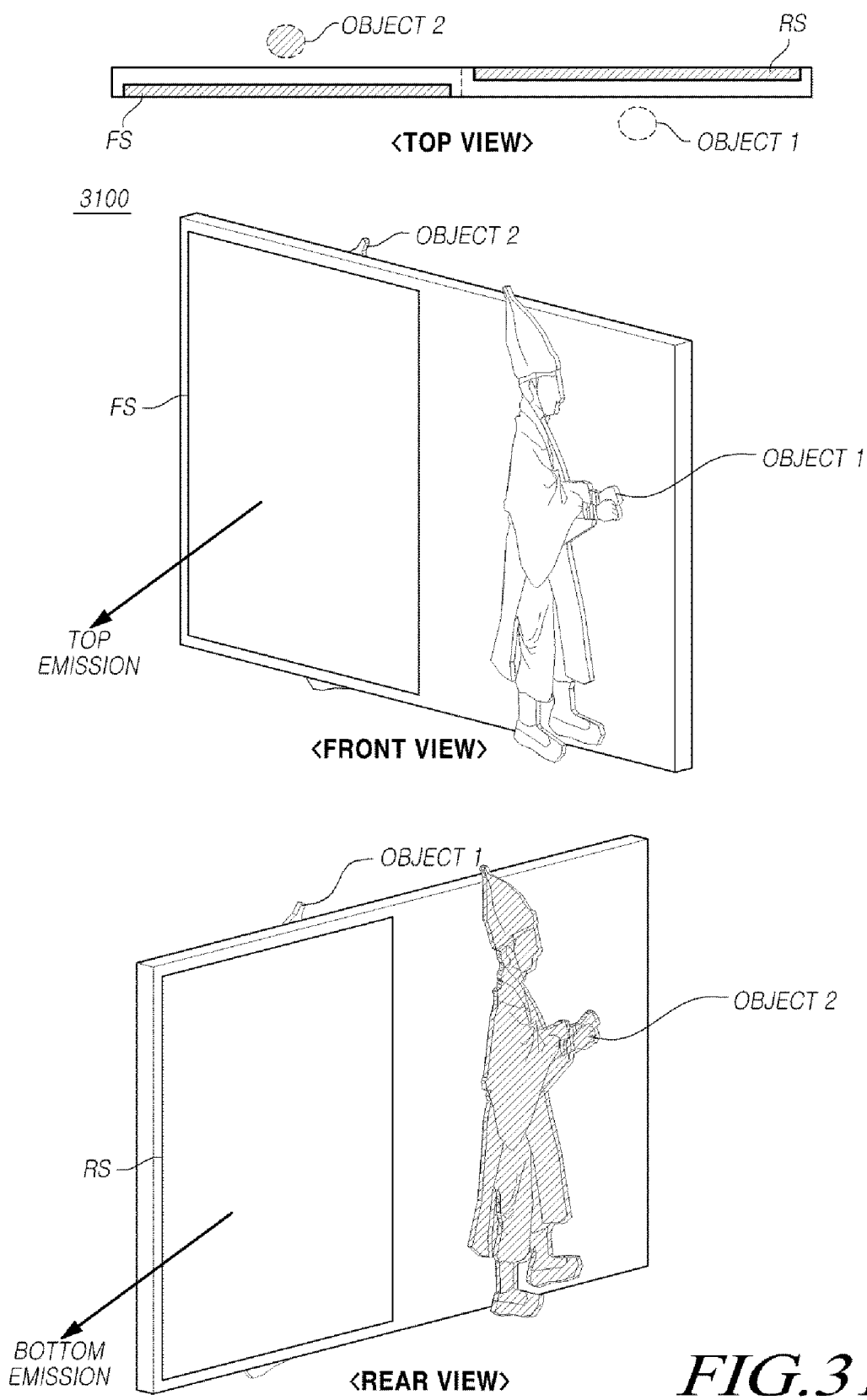
FIG. 31 illustrates a public display device as another product application of a display device using the display panel according to example embodiments of the present invention.

FIG. 31 illustrates a public display device 3100 as another product application of a display device 3100 using the display panel 110 according to example embodiments of the present invention.

In FIG. 31, the public display device 3100 includes the display panel 110 of FIG. 14. Here, a front screen FS corresponding to the top-emitting first area 1 can display an image or information of an object 1 positioned on the rear side of a rear screen RS corresponding to the second area A2. Further, the rear screen RS corresponding to the bottom-emitting second area A2 can display an image or information of an object 2 positioned on the rear side of the front screen FS corresponding to the first area A1.

According to the example embodiments as set forth above, it is possible to provide the novel display panel 110 having a double-sided light-emitting structure able to satisfy rapidly-changing user demands and the display device 100 including the same. In addition, it is possible to provide the display panel 110 divided into two areas having different light-emitting directions and the display device 100 including the same. Furthermore, it is possible to provide the display panel 110 having both a top emission structure and a bottom emission structure on a single substrate and the display device 100 including the same. Moreover, it is possible to provide the foldable display panel 110 able to display various types of additional information or images in a folded state and the foldable display device 100 including the same.

It will be apparent to those skilled in the art that various modifications and variations can be made in the display panel and the display device of the present invention without departing from the spirit or scope of the invention. Thus, it is intended that the present invention cover the modifications and variations of this invention provided they come within the scope of the appended claims and their equivalents.

What is claimed is:

1. A display device, comprising:
   a display panel having a plurality of data lines and a plurality of gate lines thereon, the display panel including a contiguous first area having a plurality of sub-pixels and a contiguous second area separated from the first area having a plurality of subpixels such that the first and second areas have different light-emitting directions;
   a data driver circuit configured to drive the plurality of data lines; and
   a gate driver circuit configured to drive the plurality of gate lines,
   wherein a resolution of one of the first area and the second area is lower than a resolution of the other of the first area and the second area, and
   wherein the gate lines and the data lines are disposed such that density of the sub-pixels in the lower-resolution area is smaller than that of the sub-pixels in the higher-resolution area.

2. The display device according to claim 1, wherein the display panel includes a substrate,
   wherein each of the first area and the second area includes:
     a first electrode on the substrate;
     an organic layer on the first electrode; and
     a second electrode on the organic layer,
   wherein a bottom reflective layer is between the substrate and the first electrode in one of the first area and the second area, and
   wherein a top reflective layer is on the second electrode in the other area of the first area and the second area.

3. The display device according to claim 2, wherein the substrate includes one of a glass substrate and a flexible film substrate.

4. The display device according to claim 2, wherein there is a bending area between the first area and the second area.

5. The display device according to claim 4, wherein each of the first electrode, the organic layer and the second electrode has a step portion in the bending area.

6. The display device according to claim 1, wherein a size of each of the second area is smaller than a size of the first area.

7. The display device according to claim 1, wherein a size of the first area is substantially the same as a size of the second area.

8. The display device according to claim 1, wherein one of the first area and the second area includes an image display area, and the other of the first area and the second area includes an additional information display area.

9. The display device according to claim 1, wherein a boundary between the first area and the second area is oriented in a first direction, and a length of the second area in the first direction is less than a length of the first area in the first direction.

10. The display device according to claim 1, wherein a boundary between the first area and the second area is oriented in a first direction, and the length of the second area in the first direction and the length of the first area in the first direction have the same size.

11. The display device according to claim 1, wherein the display panel is foldable along a boundary between the first area and the second area or is foldable along points by which the first area or the second area is divided into at least two sub-areas.

12. The display device according to claim 11, wherein, when the display panel is folded along the boundary between the first area and the second area, the second area covers all or a portion of the first area.

13. The display device according to claim 11, wherein, when the display panel is folded along the points by which the first area is divided into at least two sub-areas, at least one sub-area of the at least two sub-areas covers the other sub-area of the at least two sub-areas.

14. The display device according to claim 11, wherein, when the display panel is folded, one of the first area and the second area is a display-off area, and the other of the first area and the second area is a display-on area.

15. The display device according to claim 1, wherein a boundary between the first area and the second area is parallel to the plurality of gate lines.

16. The display device according to claim 1, wherein a boundary between the first area and the second area is parallel to the plurality of data lines.

17. The display device according to claim 1, wherein the gate driver circuit includes:
  a first gate driver configured to drive gate lines among the plurality of gate lines through which subpixels in the first area are caused to generate light; and
  a second gate driver configured to drive gate lines among the plurality of gate lines through which subpixels in the second area are caused to generate light.

18. The display device according to claim 1, wherein the data driver circuit includes:
  a first data driver configured to drive data lines among the plurality of data lines through which subpixels in the first area are caused to generate light; and
  a second data driver configured to drive data lines among the plurality of data lines through which subpixels disposed in the second area are caused to generate light.

19. A display panel, comprising:
a substrate;
a first electrode on the substrate;
an organic layer on the first electrode; and
a second electrode on the organic layer,
wherein the display panel includes a contiguous first area having a plurality of subpixels and a contiguous second area separated from the first area having a plurality of subpixels such that the first and second areas have different light-emitting directions, and
wherein the display panel further includes:
  a bottom reflective layer between the substrate and the first electrode in the first area, and
  a top reflective layer on the second electrode in the second area,
wherein a resolution of one of the first area and the second area is lower than a resolution of the other of the first area and the second area, and
wherein the display panel further includes a plurality of data lines and a plurality of gate lines, and the gate lines and data lines are disposed such that density of the sub-pixels in the lower-resolution area is smaller than that of the sub-pixels in the higher-resolution area.

20. The display panel according to claim 19, wherein the bottom reflective layer is formed in an entirety of the first area, and the top reflective layer is formed in an entirety of the second area.

21. A display panel, comprising:
a substrate;
a plurality of top emission devices on the substrate in a contiguous first area having a plurality of subpixels; and
a plurality of bottom emission devices on the substrate in a contiguous second area having a plurality of subpixels that does not overlap the first area,
wherein a resolution of one of the first area and the second area is lower than a resolution of the other of the first area and the second area, and
wherein the display panel further includes a plurality of data lines and a plurality of gate lines, and the gate lines and data lines are disposed such that density of the sub-pixels in the lower-resolution area is smaller than that of the sub-pixels in the higher-resolution area.

* * * * *